(12) United States Patent
Handtmann et al.

(10) Patent No.: US 8,209,826 B2
(45) Date of Patent: Jul. 3, 2012

(54) METHOD FOR MANUFACTURING A COUPLED RESONATOR DEVICE

(75) Inventors: Martin Handtmann, Munich (DE); Klaus-Guenter Oppermann, Holzkirchen (DE); Martin Fritz, Munich (DE)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 380 days.

(21) Appl. No.: 12/110,961

(22) Filed: Apr. 28, 2008

(65) Prior Publication Data
US 2009/0265903 A1    Oct. 29, 2009

(51) Int. Cl.
*H04R 17/00*    (2006.01)
*C23F 1/00*    (2006.01)

(52) U.S. Cl. ........ 29/25.35; 29/594; 29/847; 310/313 R; 310/364

(58) Field of Classification Search .......... 29/594, 29/593, 25.35; 216/52, 72; 310/312; 333/189, 333/334, 32
See application file for complete search history.

(56) References Cited

U.S. PATENT DOCUMENTS

| 6,307,447 B1 * | 10/2001 | Barber et al. | 333/189 |
| 6,339,276 B1 * | 1/2002 | Barber et al. | 310/312 |
| 6,720,844 B1 * | 4/2004 | Lakin | 333/189 |
| 7,098,573 B2 * | 8/2006 | Stommer | 310/320 |
| 7,612,636 B2 * | 11/2009 | Jamneala et al. | 333/189 |
| 7,631,412 B2 * | 12/2009 | Barber et al. | 29/594 |
| 7,786,826 B2 * | 8/2010 | Thalhammer et al. | 333/189 |
| 2004/0029356 A1 | 2/2004 | Timme et al. | |
| 2004/0150293 A1 | 8/2004 | Unterberger | |
| 2007/0176710 A1 * | 8/2007 | Jamneala et al. | 333/191 |
| 2008/0309432 A1 | 12/2008 | Fattinger et al. | |

FOREIGN PATENT DOCUMENTS
DE    10315239    10/2004

* cited by examiner

*Primary Examiner* — Minh Trinh

(57) ABSTRACT

A method for manufacturing a coupled resonator device includes forming a first BAW-device on a first substrate, forming a second BAW-device on a second substrate, and bonding the first and the second BAW-device such that the bonded first and second BAW-device are sandwiched between the first and second substrate.

9 Claims, 21 Drawing Sheets

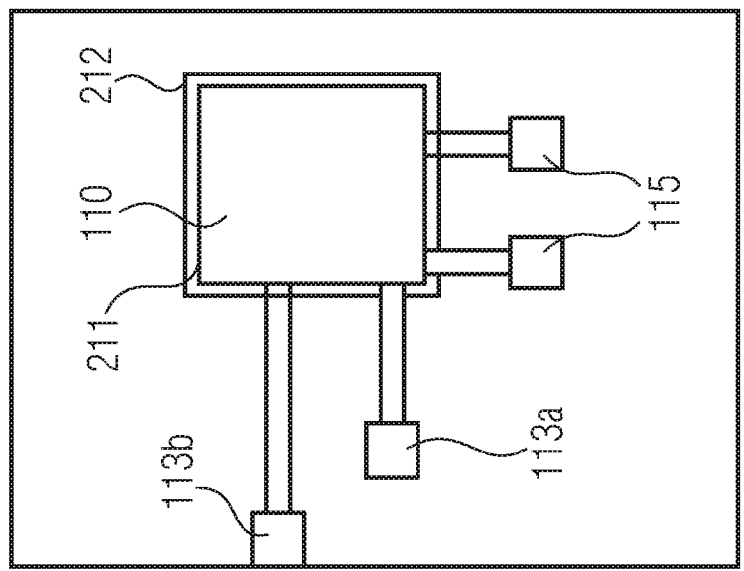
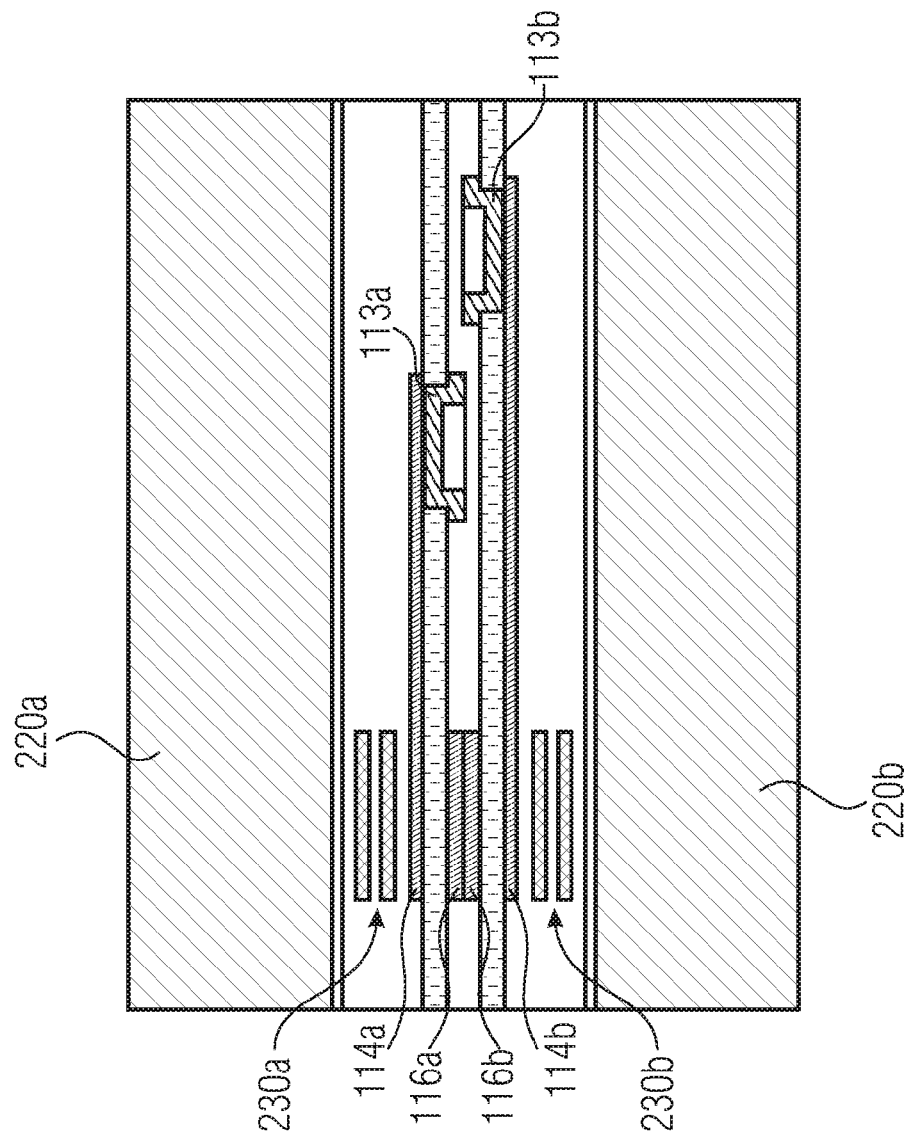
FIG 5B
FIG 5C

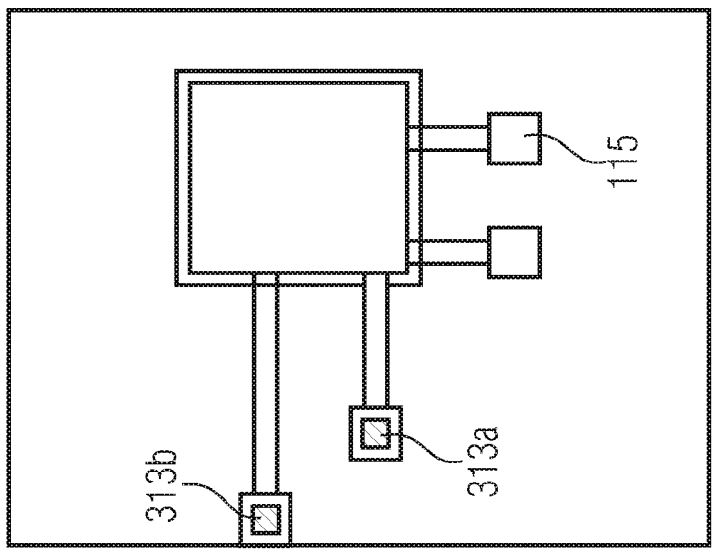
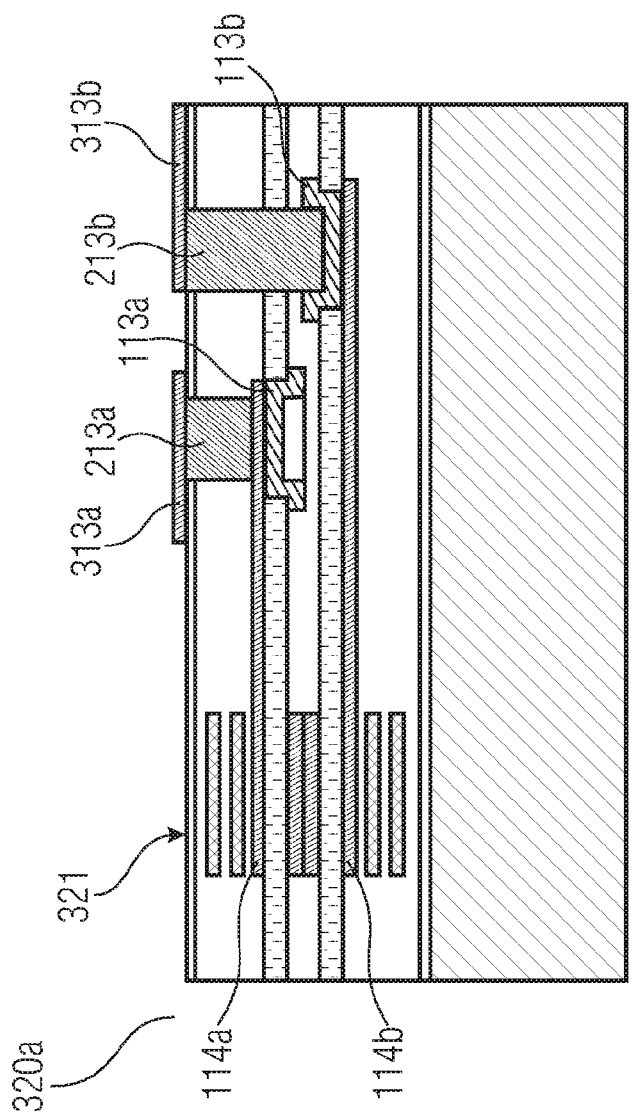
FIG 6B
FIG 6A

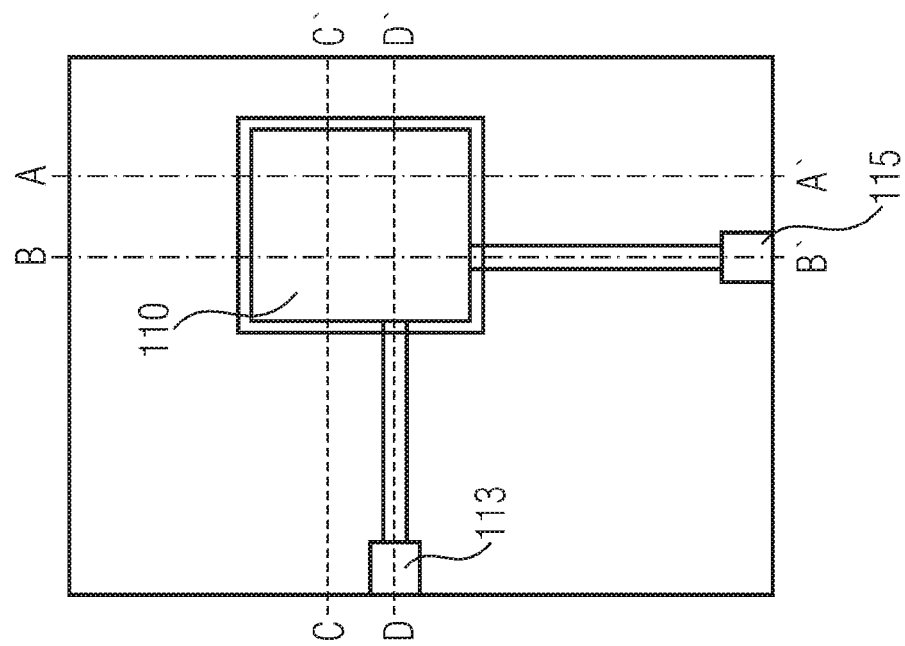
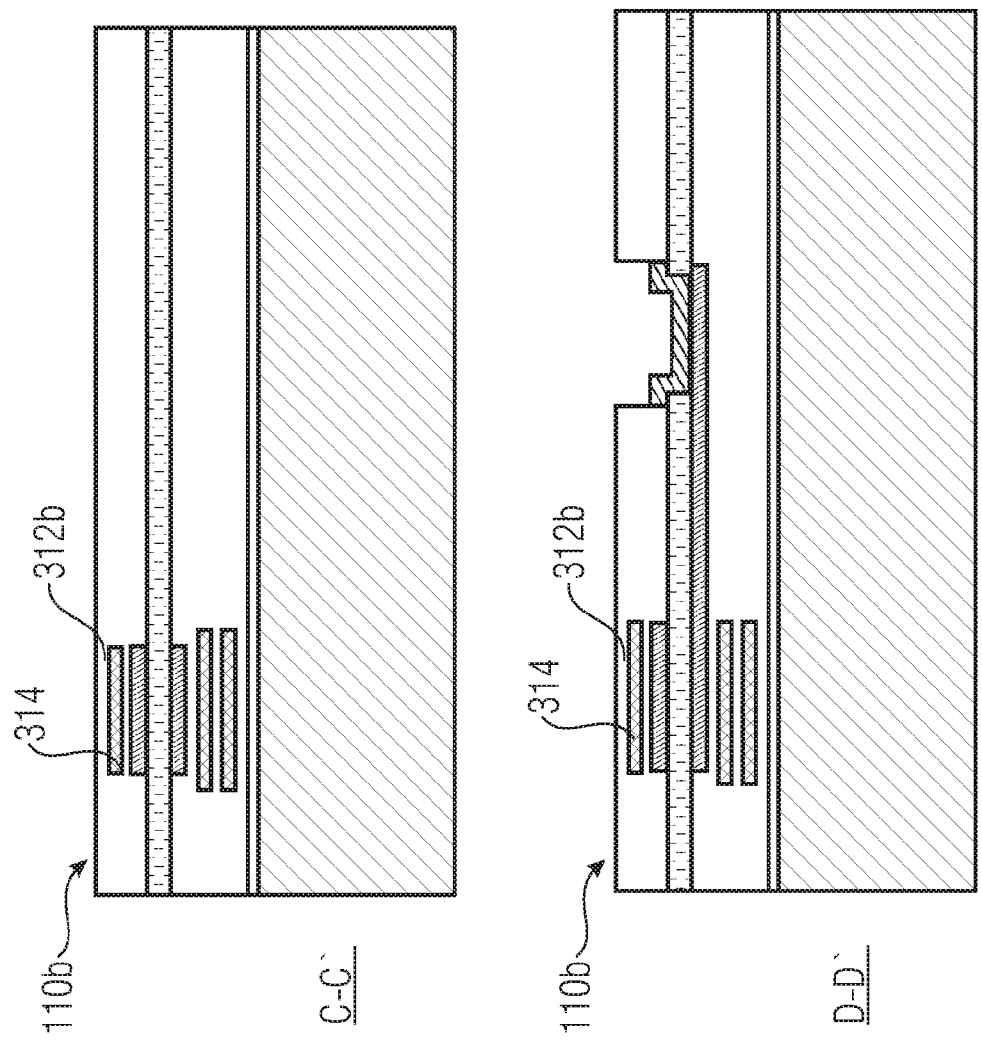
FIG 8C

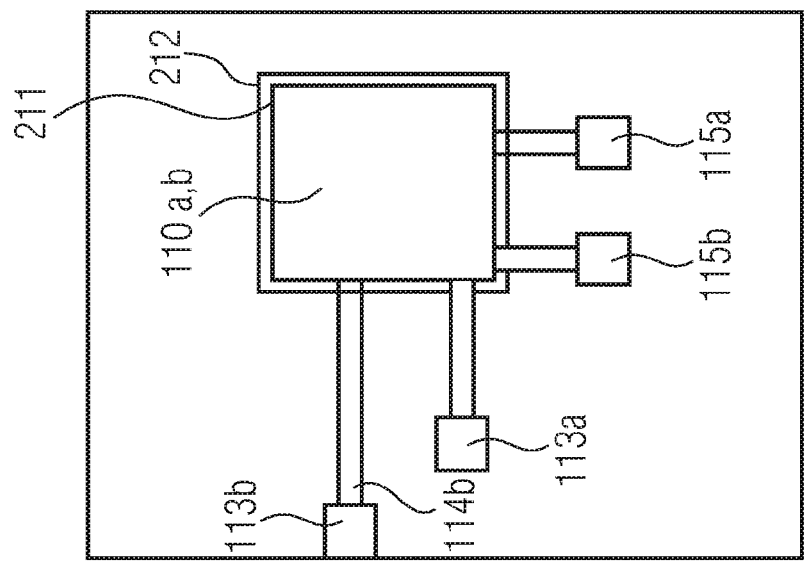
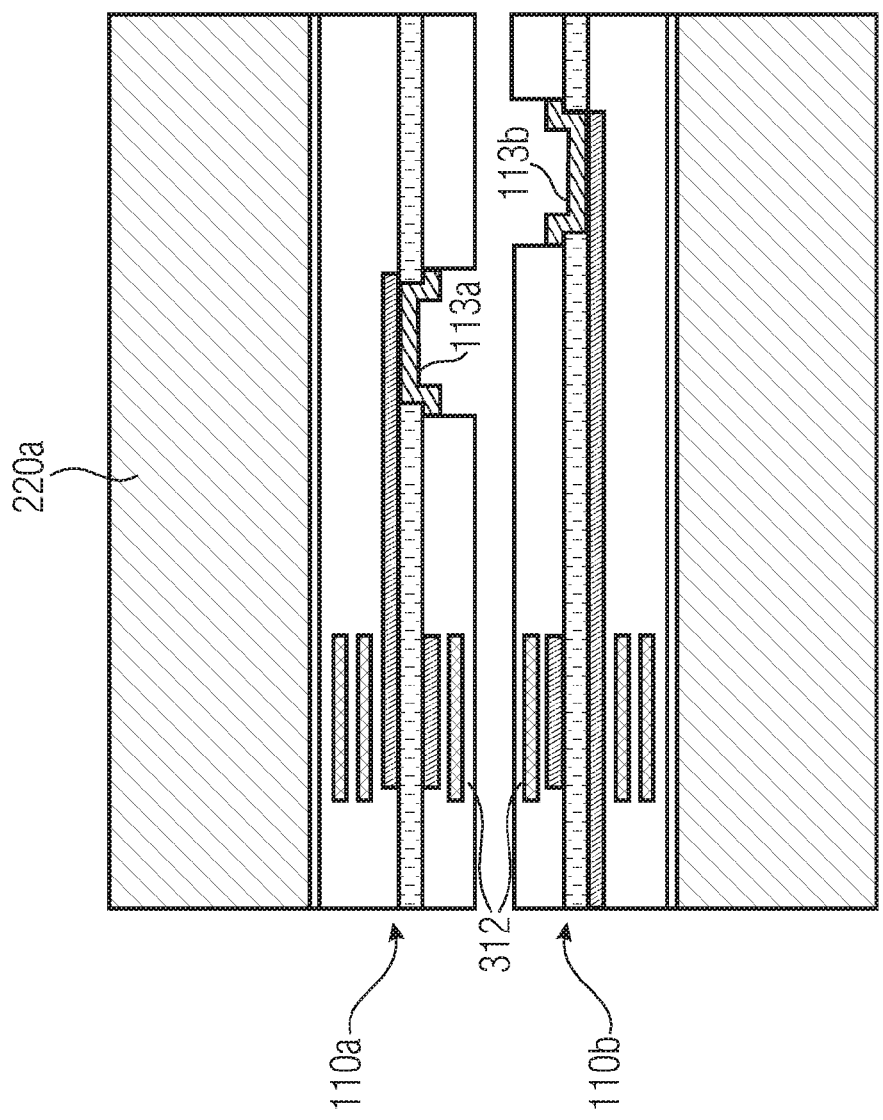
FIG 9B
FIG 9A

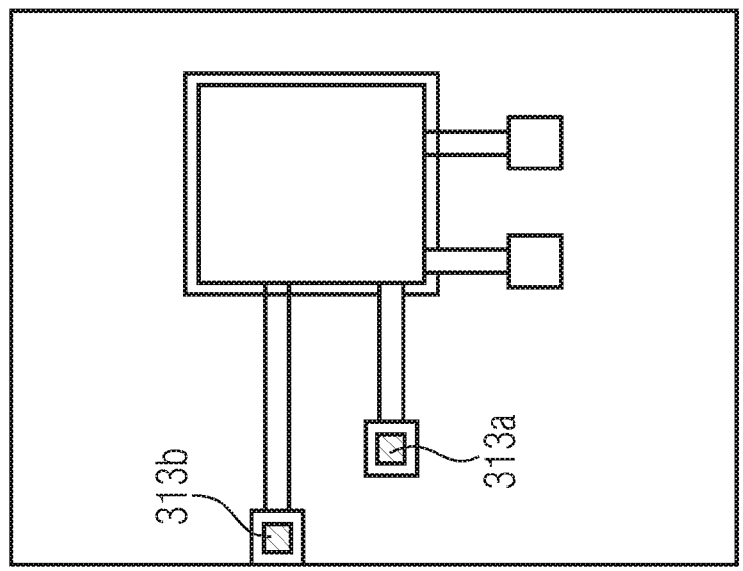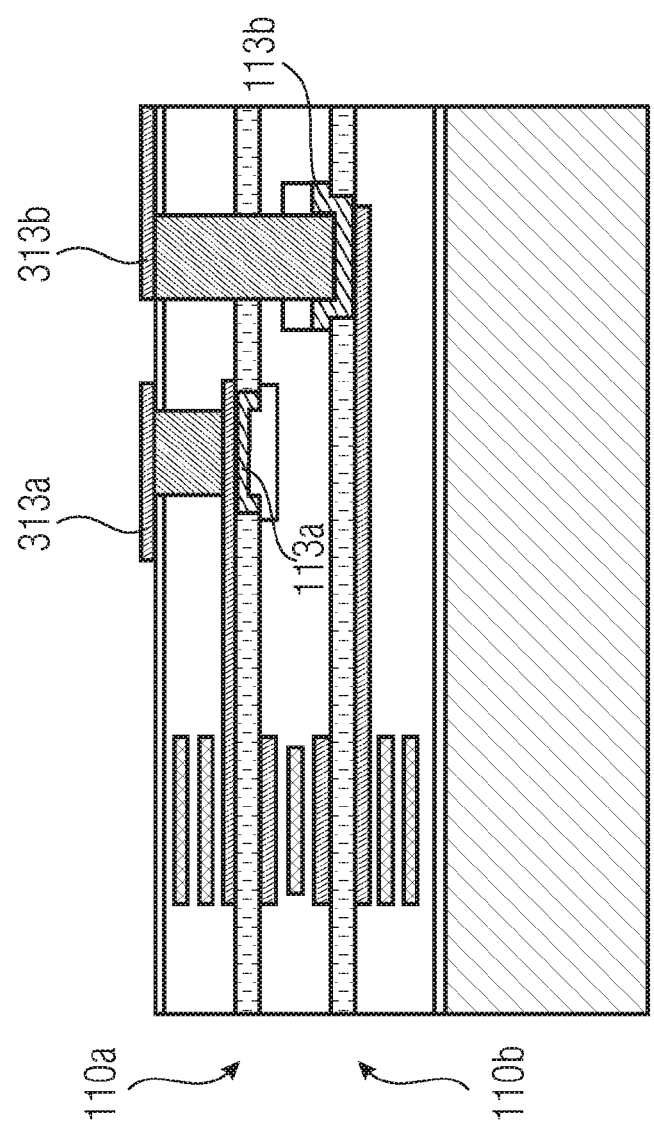

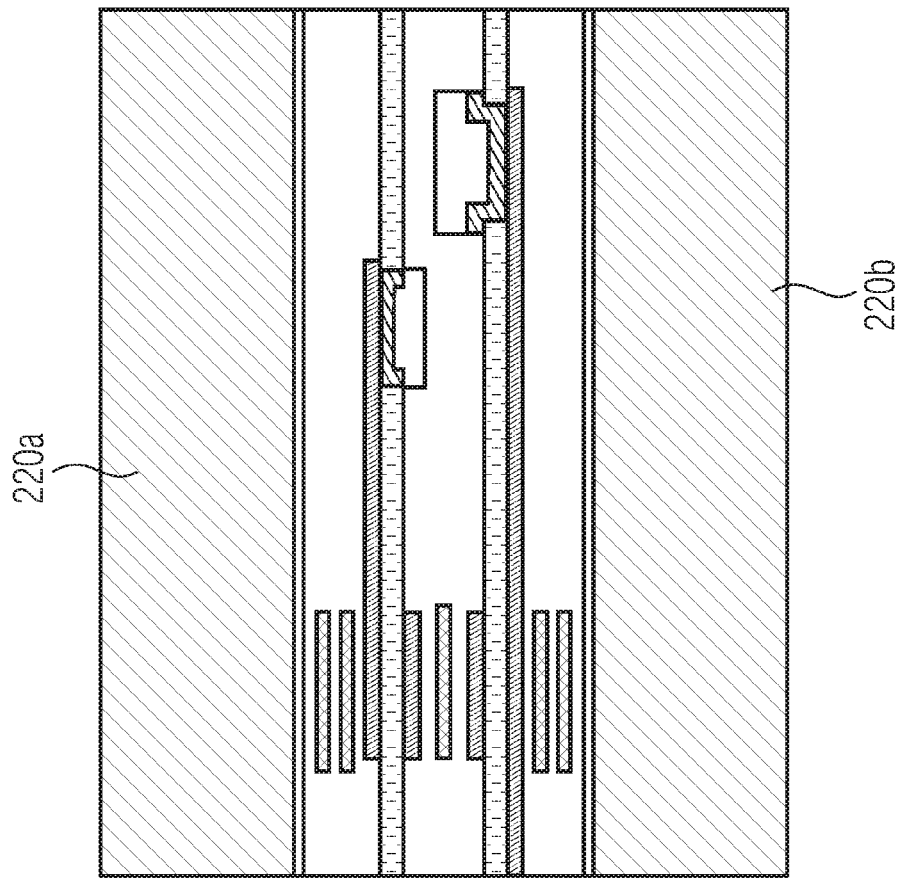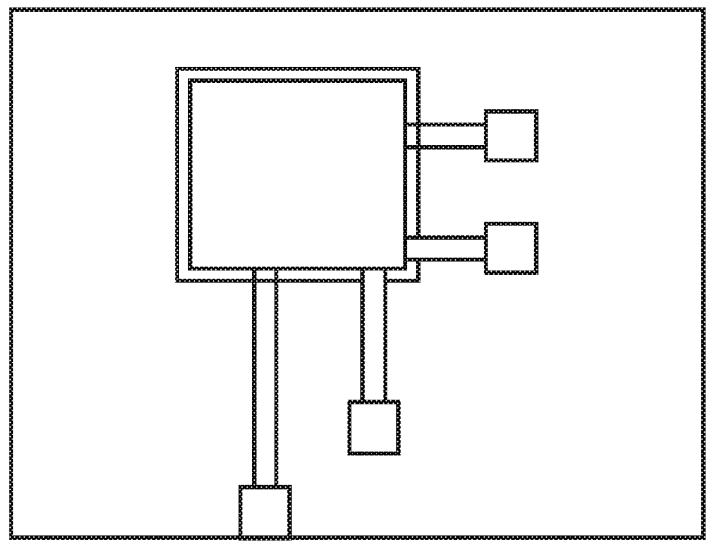

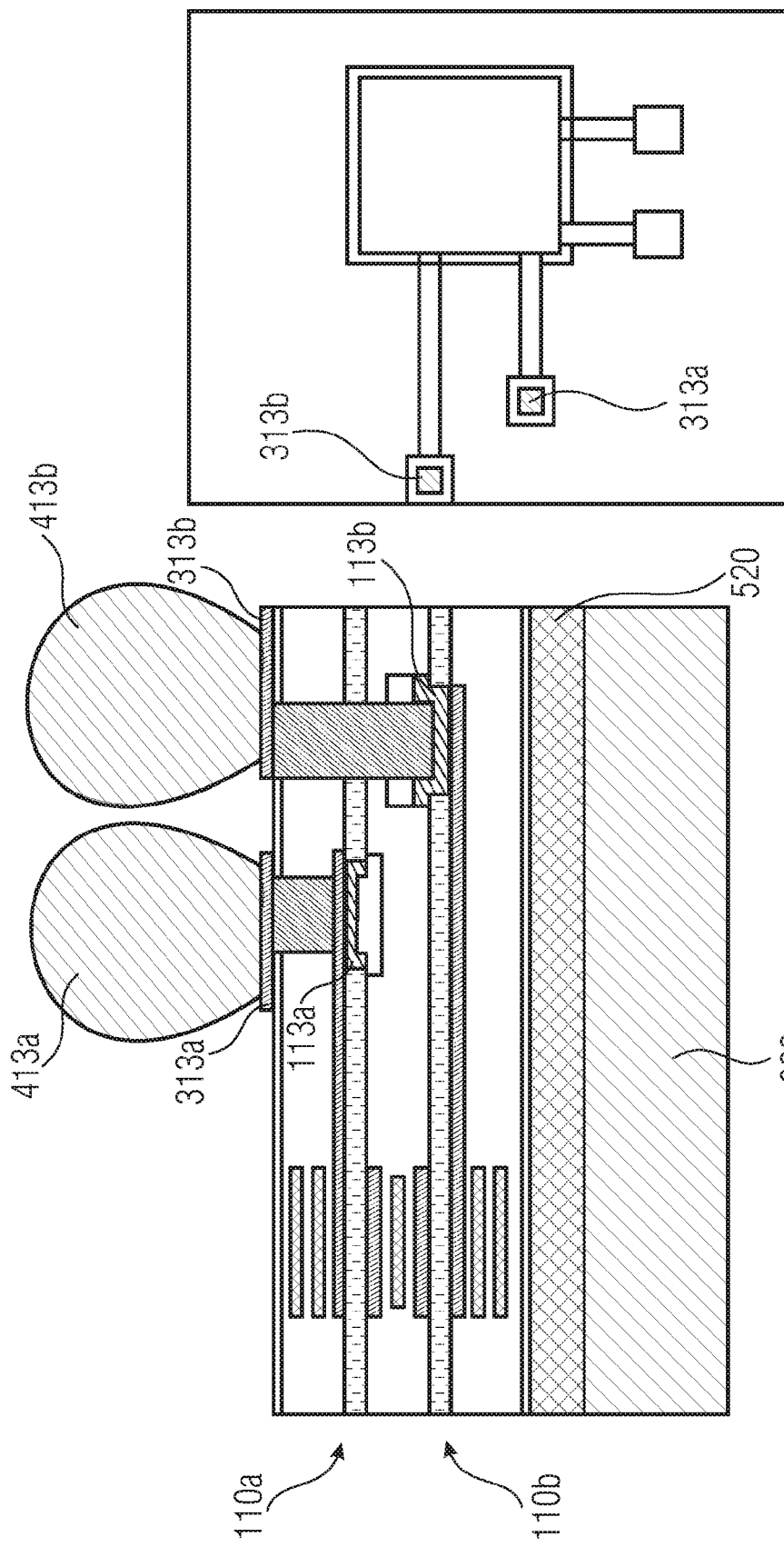

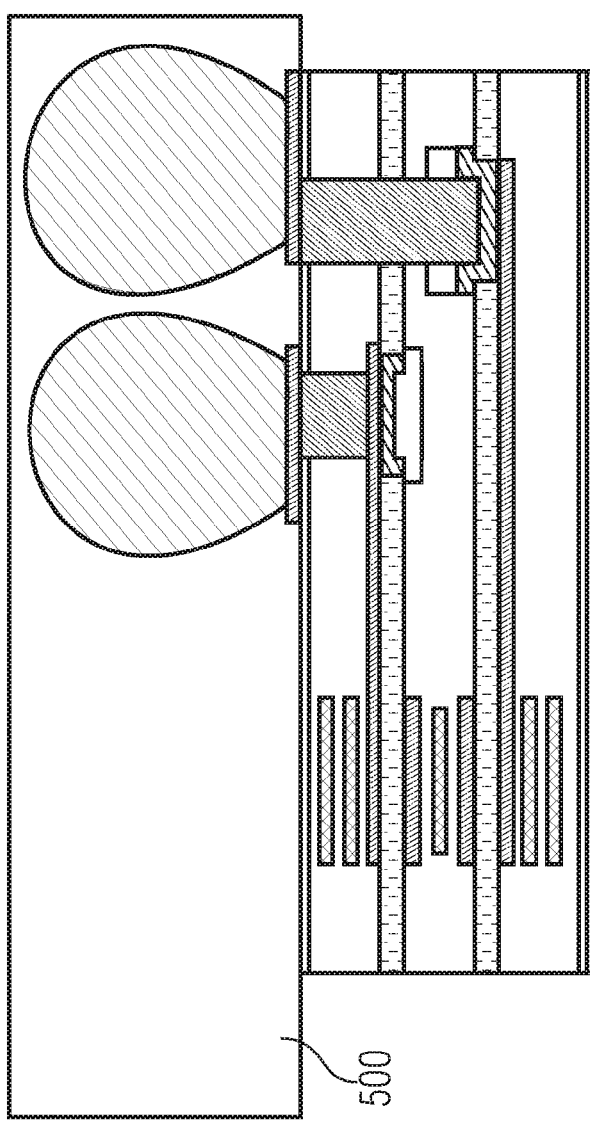
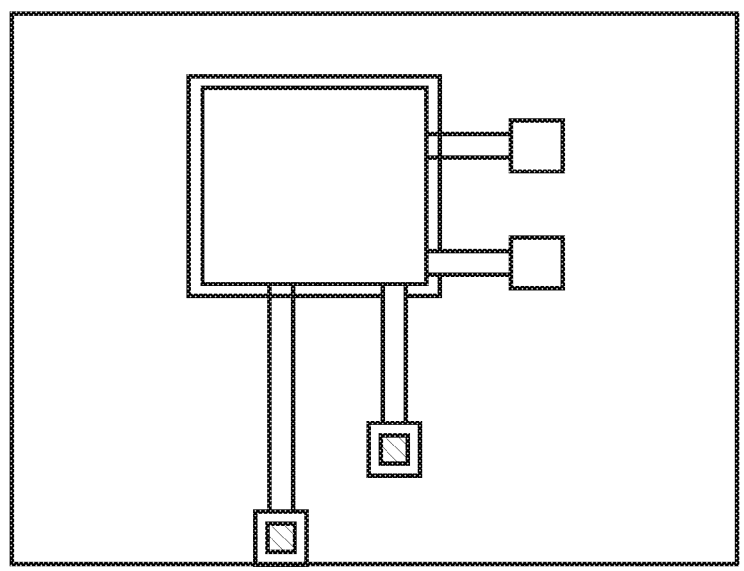
FIG 16A
FIG 16B

METHOD FOR MANUFACTURING A COUPLED RESONATOR DEVICE

Embodiments of the present invention relate to the field of a piezoelectric resonator structure and a method for manufacturing a coupled resonator device.

BACKGROUND

Embodiments of the present invention describe a method for manufacturing a coupled resonator device, comprising forming a first BAW-device on a first substrate, forming a second BAW-device on a second substrate, and bonding the first and the second BAW-device such that the bonded first and second BAW-device are sandwiched between the first and second substrate.

BRIEF DESCRIPTION OF THE DRAWINGS

Embodiments of the present invention will be detailed subsequently referring to the appended drawings, in which:

FIGS. 5a to 5c are a top view and cross-sectional views of processed BAW devices before and after bonding;

FIGS. 6a and 6b are a top view and a cross-sectional view after removing the upper substrate;

FIGS. 8a to 8c are a top view and cross-sectional views of a second processed first and second BAW device;

FIGS. 9a to 9d are top views and cross-sectional views of the first and second BAW device before and after the bonding;

FIGS. 10a and 10b are a top view and a cross-sectional view of the resonator of FIG. 9 after removing a substrate and generating via contacts;

FIGS. 11a and 11b are a top view and a cross-sectional view through the coupled resonator after the bonding according to a further embodiment;

FIGS. 15a and 15b are a top view and a cross-sectional view through the resonator of FIG. 11 after generating solder balls; and FIGS. 16a and 16b are a top view and a cross-sectional view through the coupled resonator of FIG. 11 after laminating onto a sawing film.

Before the present invention will be detailed in the following with reference to the drawings, it should be understood that same elements in the figures are provided with same or similar reference numerals and a renewed description of these elements is omitted.

DETAILED DESCRIPTION OF ILLUSTRATIVE EMBODIMENTS

Figure 1:
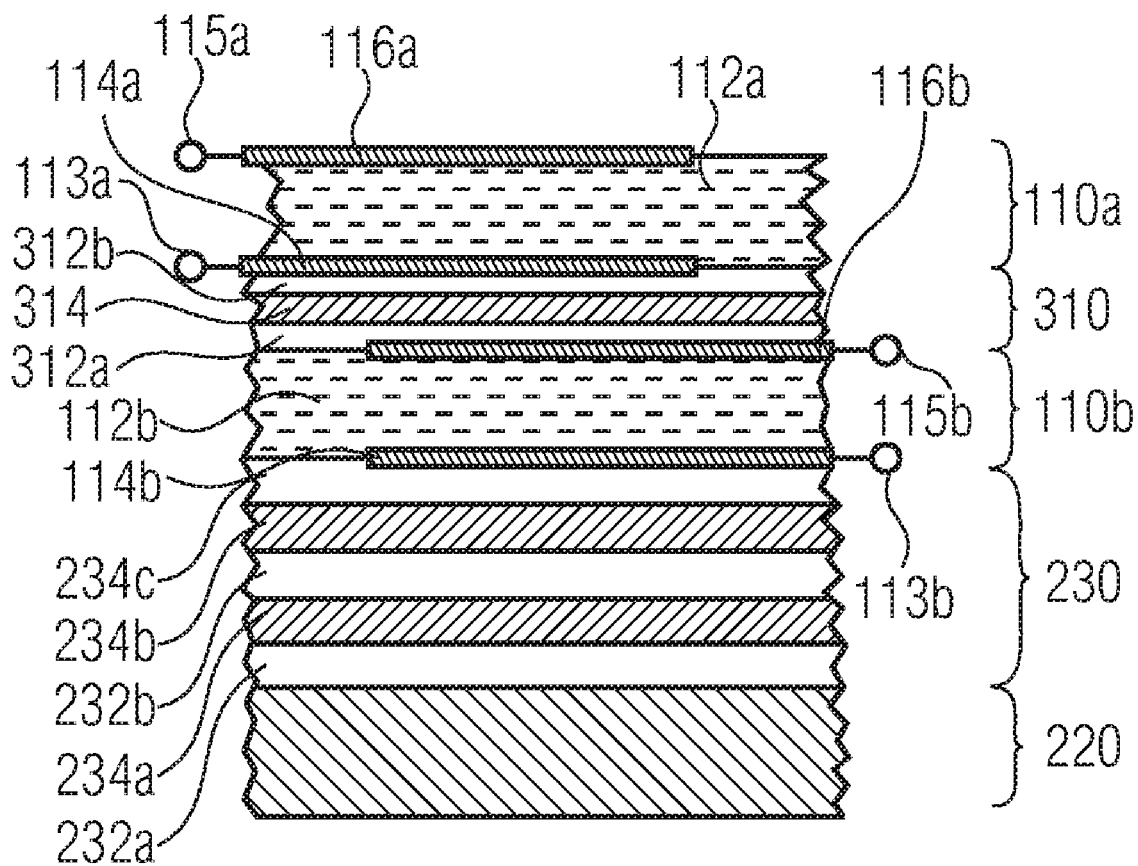
FIG. 1 is a cross-sectional view through a coupled acoustic resonator.

Coupled resonator filters (CRF=coupled resonator filter), or stacked crystal filters (SCF=stacked crystal filter) are examples for acoustically coupled resonators in a thin-layer design. A filter characteristic is achieved by the characteristic coupling of the resonators. For adjusting this filter characteristic, a control as accurate as possible of the resonant frequencies of the individual resonators, for example, is needed.

Both CRF and SCF are coupled resonators, i.e., they comprise at least two resonators usually acoustically coupled to each other. The resonant frequencies of the two coupled resonators are determined by the entire layer stack. Both acoustic material parameters, such as speed of sound, and layer thicknesses of the individual sheets or layers are important. Even small variations in layer thicknesses may crucially change the resonant frequency, for example, and, thus, the filter characteristic of the generated coupled resonator. The sensitivity of resonant frequencies to changes in layer thicknesses is very different among the individual layers. Typically, both the layer thicknesses of the electrodes and the layer thicknesses of the piezoelectric layer of the respective resonator determine its resonant frequency stronger than layer thicknesses of relatively more distant layers.

By regular variations in layer thicknesses and material parameters of the individual layers due to manufacture, the desired resonant frequency of the individual resonators generally cannot be adjusted with standard processes and, thus, the ideal filter characteristic is hard to achieve.

Generally, technological methods are used in the manufacture of BAW filters to deliberately thin or strengthen individual layers to compensate for these variations due to manufacture. For example, this can be achieved by depositing additional layer material, or etching away part of the layer after the layer stack (developed until then) has been characterized. Characterizing the layer stack may be made by a resonant frequency measurement, for example. Local ion beam etching is a frequently used method for thinning layers.

A standard BAW resonator comprises a piezoelectric layer which is formed between two opposed electrodes and whose average polarization (orientation) is generally perpendicular to the piezoelectric layer. The standard BAW resonator may be formed as a membrane or formed on a substrate, wherein, in the latter case, the substrate generally comprises an acoustic mirror so that the substrate is acoustically de-coupled from the BAW resonator.

Thus, BAW resonators may be formed as so-called SMR resonators (solidly mounted resonator), wherein SMR resonators are formed on a surface of a substrate and the substrate typically comprises an acoustic mirror. Alternatively, it is possible to form BAW resonators as membranes, wherein membranes are characterized either by an air interface being formed on both sides. The BAW resonator can also be formed on a carrier substrate that, in turn, is separated from an underlying main substrate by an air interface so that a further membrane device is formed.

The resonant frequency of the BAW resonator critically depends on the geometry of the individual layers. Thus, while typically only one layer is corrected in a standard BAW resonator to adjust the resonant frequency, at least two layers have typically to be corrected in a CRF to be able to adjust the two resonant frequencies of the coupled resonators independently from each other or to adjust one frequency with respect to the other frequency. For example, the one layer corrected in the BAW resonator is the upper electrode deposited as the last one on the piezoelectric layer. After forming the BAW resonator, it is only this electrode, which is typically still accessible, in contrast to the piezoelectric layer, or the lower electrode (at least for an SMR device). In this context, is advantageous to perform the correction of the layer thicknesses at the end of the processes after all layer thicknesses with their variations due to manufacture and/or their resonant frequencies of the device have been characterized.

If the BAW resonator (non-SMR) is formed as a membrane, trimming may be made at the end of the processing if the bottom and top layer are trimmed, which, however, involves significant effort. However, this is not possible for an SMR CRF, since the bottom layer is not acoustically active due to the acoustic mirror formed on the substrate.

In addition, since the underlying layers in an SMR CRF are not accessible anymore after deposition, other concepts are needed for trimming or frequency correction of both resonators.

Usually, BAW, SCF and CRF resonators are fabricated on a substrate. To achieve an acoustic insulation, the resonator is, as outlined above, either set on a membrane in the substrate or on an acoustic mirror. At the surface of the resonator, the acoustic insulation is usually achieved by air, which has very low acoustic impedance compared to the impedance of a solid material. However, the presence of this air layer causes difficulties in the semiconductor fabrication, for example, if common packaging technologies such as overmolding are used. Alternatively, the formed air layer may be formed by a realization of a cavity over the resonators before molding.

In the conventional technique, the layer stacks of a CRF are fabricated sequentially. Thereby, the lower resonator structure (closer to the substrate) is formed prior to the upper resonator structure (more distant from the substrate). Thus, for conventional SMR CRF at least one layer of the lower resonator is corrected before completing the layer stack so that the two resonant frequencies can be adjusted independently (in two subsequent steps) from each other. A possible method comprises a selective thinning (or strengthening) of the electrodes of the lower resonator after their deposition and, in addition, a corresponding thinning (or strengthening) of a layer after the end of the processing of the upper resonator. Each thinning (or strengthening) process is performed such that the resonant frequencies of the lower and the upper resonators adjust themselves to target values. As already described above, it is important in this context that both resonant frequencies be adjusted in dependence on each other to achieve a desired filter characteristic (e.g., the frequency difference should comprise a target value). Basically, the upper resonator after forming couples acoustically to the lower resonator resulting in a shift in the resonant frequency and primarily this shifted resonant frequency is tuned by the thinning (or strengthening) of the layer of the upper resonator.

A disadvantage to this conventional method is that, at the point of trimming the lower resonator, the remaining layer stack is only theoretically (i.e., ideally) known in the calculations of a target value of the layer thickness. As a rule, however, occurring fabrication variations frequently deviate from idealized values. Therefore, in this conventional method, only the layer stack fabricated until then may be characterized and corrected. At the end of the process, the fabrication variations are again corrected after characterizing the entire layer stack, however, a possible remaining discrepancy of the lower resonator cannot be corrected anymore. Therefore, high losses in yield are unavoidable since many of the fabricated filters do not exhibit the required characteristic.

A further disadvantage of the conventional processing involves a cavity formed on the surface to achieve an acoustic de-coupling by an air interface. This processing involves, on one hand, a significant increased number of process steps and, on the other hand, increases the construction height of the device typically by several 10 µm.

Thus, any fabrication tolerances of layers still to be deposited, which are unknown up to this point, mean a deviation from the ideal filter characteristic. An exact a priori knowledge of the respective layers still to be deposited or their layer thicknesses is not possible. Thus, a method is needed which allows performing independent adjustments of all parameters (e.g., trimming of layer thicknesses) during fabrication.

Embodiments of the present invention describe a method for manufacturing a coupled resonator device, comprising a forming of a first BAW-device on a first substrate, a forming of a second BAW-device on a second substrate, a trimming of the first BAW-device and finally a bonding of the first and second BAW-device such that the bonded first and second BAW-devices are sandwiched between the first and second substrate. Thus, embodiments are based on bonding two BAW devices in a way that both BAW-devices are acoustically coupled and a bonded coupled resonator filter is formed.

In order to allow an independent adjustment of the parameters, initially the lower (or first) resonator is fabricated on a first substrate, and the upper (or second) resonator is fabricated on a second substrate. Then, the acoustically coupled device is realized by bonding both resonators. In order to form the convention layer stack (only one substrate and only one acoustic mirror), one resonator is directly formed on the substrate or the mirror/membrane is removed from one side after the bonding.

For example, advantages of embodiments for the method include that the resonators to be coupled are known immediately before bonding or may be measured before bonding and, with knowledge of the respective partner, may be adjusted independently from each other. For example, the adjustment may be made by performing selective ion beam etching to change a layer thickness of an exposed electrode, for example. Both these simultaneous trimming processes may precisely adjust the exemplary resonant frequencies with respect to each other. Thereby, it is possible to react to variations in the process (e.g., layer thickness variations during layer deposition) and to achieve the desired filter performance or filter characteristic.

A further advantage of embodiments is that an acoustic mirror for the respective BAW device may be formed on both substrates or a membrane may be realized in a simple manner. For example, after bonding, one acoustic mirror lies over and the other acoustic mirror lies under the device. In the case of acoustic mirrors being formed for both resonators (or being formed under both resonators), standard methods of semiconductor technologies may be used in the packaging, e.g., no cavity or air interface needs to be realized. Additionally, after the bonding, the substrate may completely be removed on at least one side.

The process flow of the present invention may be characterized by three embodiments, for example.

A first exemplary embodiment comprises an SCF in which a first BAW device is generated on a first substrate and trimmed in a target frequency range by conventional trimming steps. Depending on the trimming results a second BAW device is trimmed on a second substrate such that they together result in a functioning SCF filter with desired filter properties.

For example, the bonding operation may be performed by means of pressure and a particular temperature, wherein a direct bond or a bond with an intermediate layer may be performed. If the intermediate layer is very thin and not electrically conductive, the two inner electrodes (separated by the intermediate layer) may be considered as short-circuited (capacitive short circuit). However, if this capacitive short circuit is insufficient, the electrical connection of the inner electrodes required for an SCF may also be realized at another location (outside the resonator region). For example, spin-on-glass, which may be deposited very thinly (d<500 nm), can be used as an intermediate layer. In the further process flow of this first exemplary embodiment, the first substrate may be removed and the electrodes may be connected to the outside by means of via contacts. For example, removal of the first substrate may be made by etching or milling, or both steps may be combined.

A second exemplary embodiment comprises a CRF, wherein the first BAW device is generated as before. Different to the embodiment previously described, the second BAW device is provided with an additional coupling layer arrangement (e.g., an oxide-metal-oxide layer) which can later serve as an acoustic coupling layer between the both coupled resonators. As a rule, the coupling layer arrangement comprises an alternating layer order of layers with high and low acoustic impedance. The bonding operation may proceed as in the embodiment previously described. Finally, in this embodiment, too, the first substrate may be removed and the electrodes of the BAW device (metals or metal layers) may be correspondingly contacted. This, in turn, may be realized by means of via contacts, for example.

Finally, a third exemplary embodiment comprises a continuation of the process flow of the first and second exemplary embodiments. The modification starts after the substrate has been removed from one side of the bonded BAW-devices, but prior to generating the contact holes (via contacts). In this embodiment, an exemplary thermal release film and a supporting substrate (or wafer) are laminated on the side free of substrate. Subsequently, the second substrate wafer may be removed and the contacts may subsequently be generated. After solder balls have been generated on the contact pads, the wafer can be laminated onto a sawing film, for example.

The three exemplary embodiments can be moreover modified by bonding entire wafers (with multiple BAW devices) instead of substrates with BAW devices. For example, trimming is made such that the respective bonding partners (which will lie on top of each other in the bonding process) are trimmed with respect to each other. In this context, the target values of the individual BAW devices on the respective wafer may differ, but will be related to their respective bonding partner.

Thus, embodiments of the present invention provide a further method for manufacturing coupled resonators, comprising: realizing a standard BAW wafer A, realizing a standard BAW wafer B, trimming wafer A and trimming wafer B, taking into account the results for wafer A and wafer B. Further embodiments also include depositing coupling layers on wafer B and optionally renewed trimming of wafer A and wafer B, taking into account the results for wafer A and wafer B. Embodiments also comprise bonding wafer A and wafer B by means of an oxide bond.

Thus, bonded acoustic devices according to embodiments of the present invention eliminate a varying frequency centerings, which develop as a result of fabrication tolerances in conventional coupled resonator filters.

FIG. 1 shows a cross-sectional view through a layer stack of an SMR CRF comprising a first BAW resonator 110a and a second BAW resonator 110b separated by an acoustic coupling layer 310. The first resonator (upper resonator) 110a comprises a first piezoelectric layer 112a sandwiched between a first electrode 114a and a second electrode 116a. The first electrode 114a is connected to a first terminal 113a, and the second electrode 116a is connected to a second terminal 115a. The second BAW resonator 110b comprises a second piezoelectric layer 112b formed between a first electrode 114b and a second electrode 116b. In the second BAW resonator 110b, too, the first electrode 114b is electrically connected to a first terminal 113b, and the second electrode 116b is electrically connected to a second terminal 115b.

The acoustic coupling layer 310 comprises a layer stack of alternating layers with high and low acoustic impedance. As an example a high acoustic impedance layer 314 being disposed between a first layer with low acoustic impedance and a second layer with low acoustic impedance. The second BAW resonator 110b is disposed on a substrate 220 with an acoustic mirror 230 such that the acoustic mirror 230 is deposited between the second BAW resonator 110b and substrate 220. The acoustic mirror 230 comprises an alternating layer order of materials with high and low acoustic impedance, as does the acoustic coupling layer 310. As an example, the acoustic mirror 230 comprises a first, a second and a third layer with low acoustic impedance 232a, 232b, 232c, each being separated by a layer with high acoustic impedance (a first layer with high acoustic impedance 234a and a second layer with high acoustic impedance 234b).

The first BAW resonator 110a is also referred to as upper resonator, and the second BAW resonator 110b is also referred to as lower resonator, wherein upper/lower refers to a distance to the substrate 220, so that the lower resonator is disposed closer to the substrate than the upper resonator.

Figure 2:
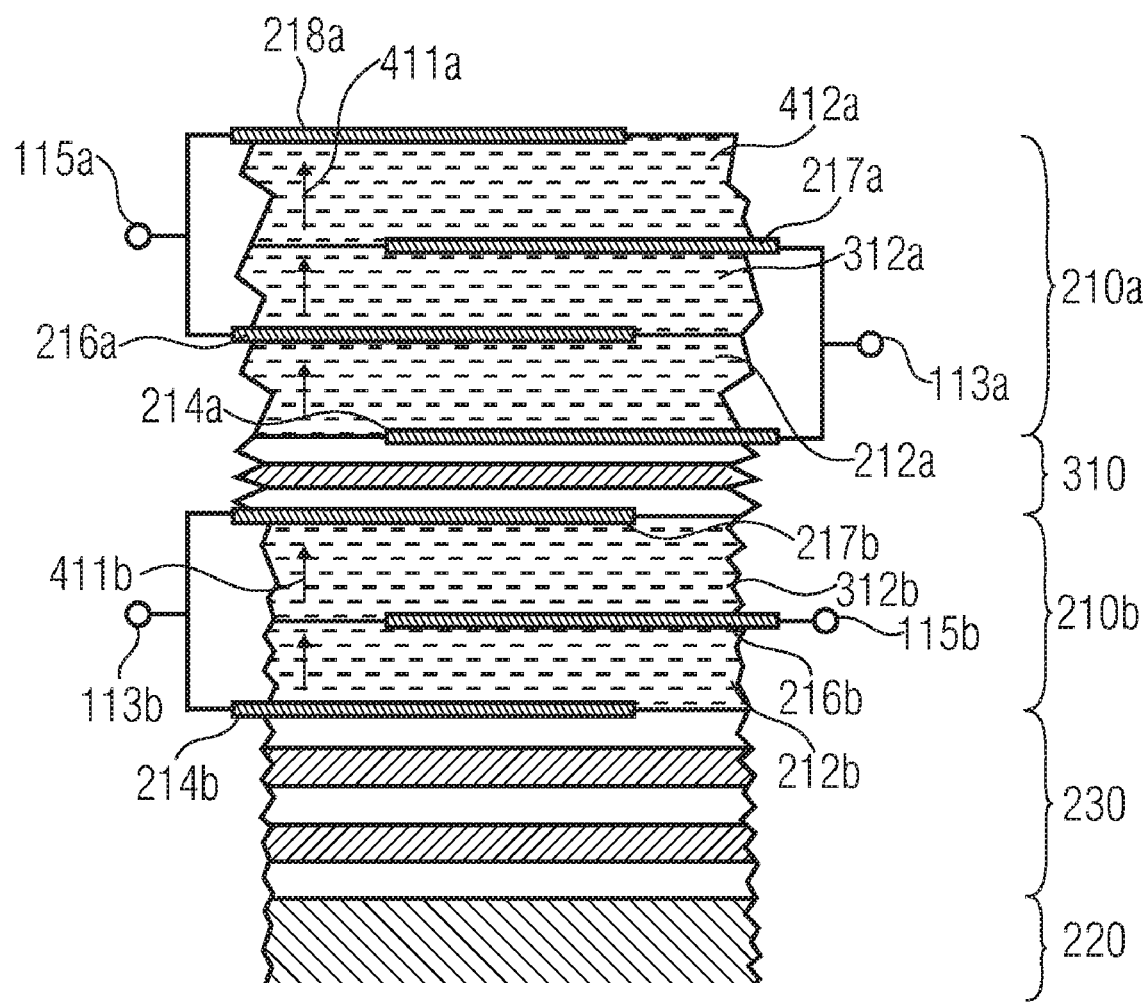
FIG. 2 is a cross-sectional view through a further coupled acoustic resonator.

FIG. 2 shows a cross-sectional view for a layer stack for a coupled SMR SCF comprising a first SCF 210a and a second SCF 210b acoustically coupled to each other by an acoustic coupling layer 310. The first SCF 210a on the whole comprises three piezo layers: a first piezoelectric layer 212a, a second piezoelectric layer 312a and a third piezoelectric layer 412a, between each of which an electrode is disposed. Thus, a first piezoelectric layer 212a is formed on a first electrode 214a, on which a second electrode 216a is formed, on which a second piezoelectric layer 312a is formed, on which a third electrode 217a is formed, on which a third piezoelectric layer 412a is formed and, finally, on which a fourth electrode 218a is formed. The first electrode 214a and the third electrode 217a are connected to a first terminal 113a, and the second electrode 216a and the fourth electrode 218a are electrically connected to a second terminal 115a.

By analogy, the second SCF 210b comprises a first electrode 214b, on which a first piezoelectric layer 212b followed by a second electrode 216b followed by a second piezoelectric layer 312b followed by a third electrode 217b are disposed. The first electrode 214b of the second SCF 210b and the third electrode 217b are connected to a first terminal 113b. The second electrode 216b is electrically connected to a second terminal 115b. The second SCF 210b is in turn deposited on an acoustic mirror 230 (as shown in FIG. 1) located between the second SCF and a substrate 220.

The first SCF 210a may in turn be designated as an upper resonator, and the second SCF 210b may be designated as a lower resonator.

The piezoelectric layers of the first and second SCF 210a, b may comprise a parallel (average) orientation, for example, as illustrated by arrows 411a, b, wherein the orientation of the piezoelectric layers may be formed perpendicular to the electrodes (e.g., form a normal direction to surface with regard to the electrodes deposited in a layer shape). However, in further embodiments, the orientation of the piezoelectric layers may deviate from this.

Figure 3:
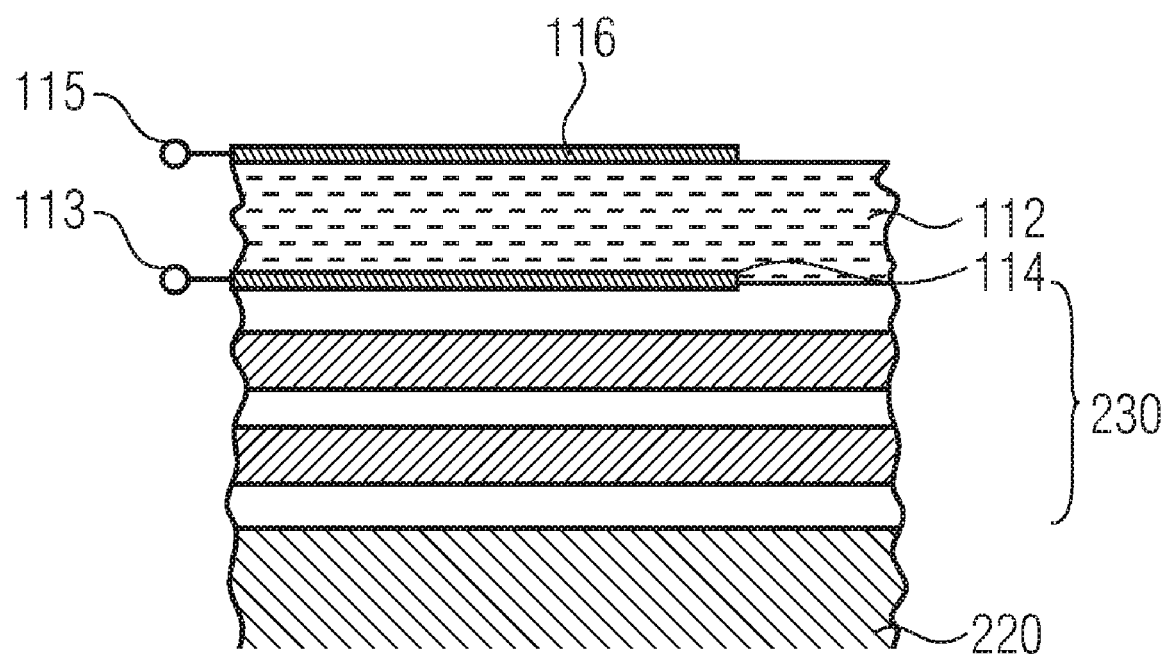
FIG. 3 is a cross-sectional view through a BAW resonator with an acoustic mirror.

FIG. 3 shows a cross-sectional view through a conventional BAW resonator formed as an SMR device. A first electrode 114 and a second electrode 116 sandwich a piezoelectric layer 112 on opposite sides. The first electrode 114 is formed on the acoustic mirror 230, for example, which in turn is disposed on the substrate 220. For example, the acoustic mirror 230 may also be formed in or on the substrate 220 by an alternating layer order of layers with high and low acoustic impedance (see description referring to FIG. 1). The first electrode 114 is electrically connected with a first terminal 113, and the second electrode 116 is electrically connected with a second terminal 115.

Figure 4A:
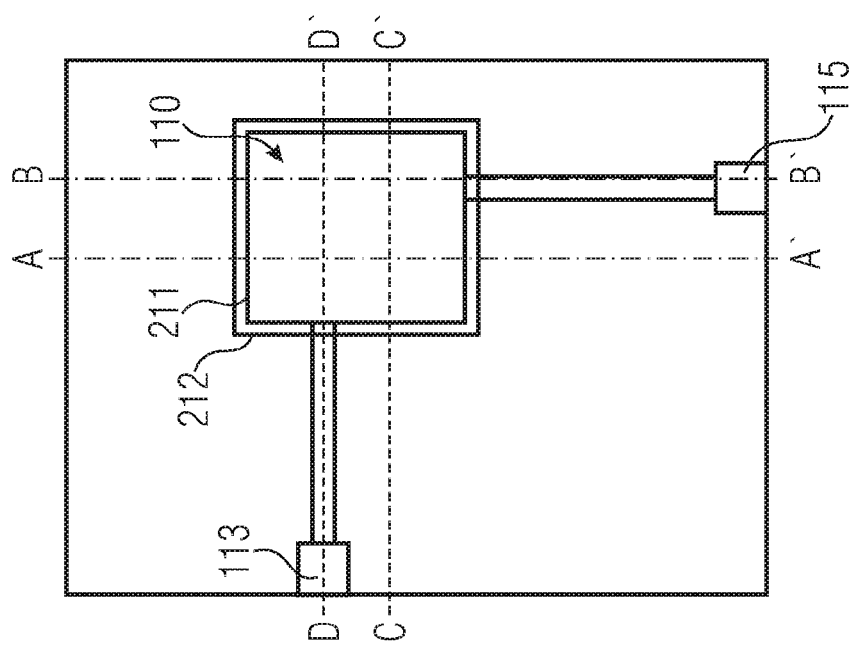
FIGS. 4a to 4c are a top view and cross-sectional views of processed BAW devices.
Figure 4C:
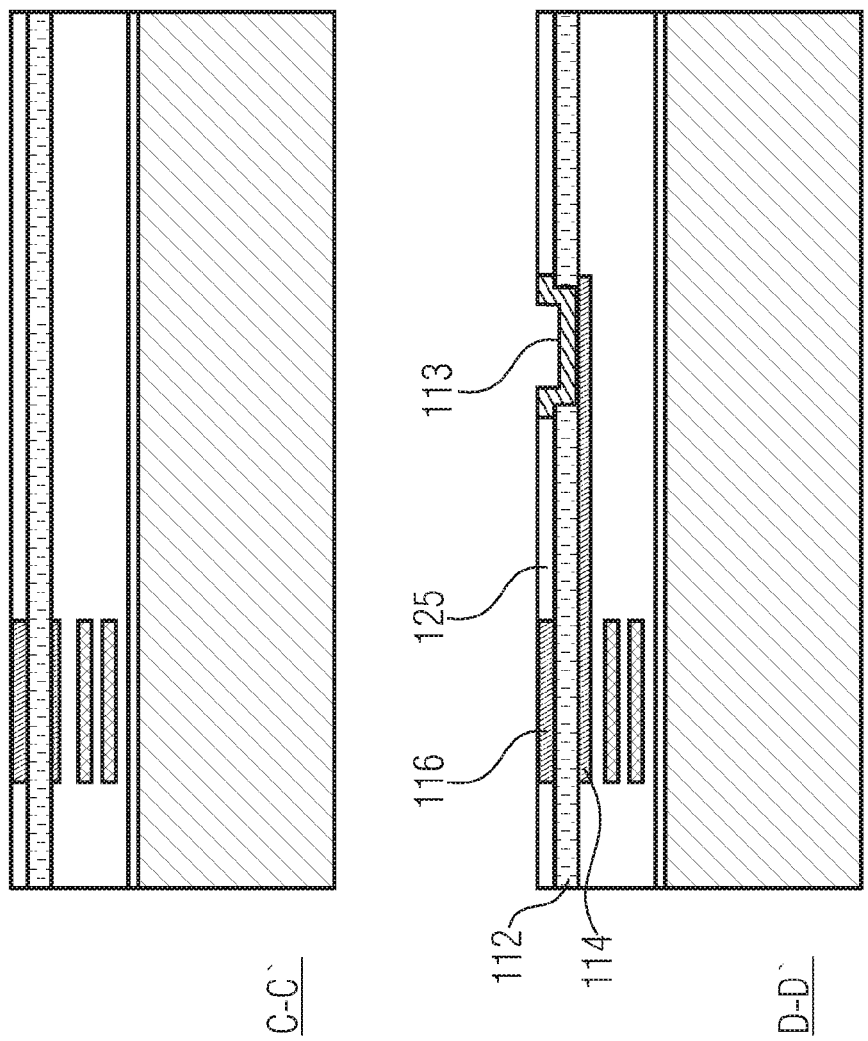
Figure 4B:
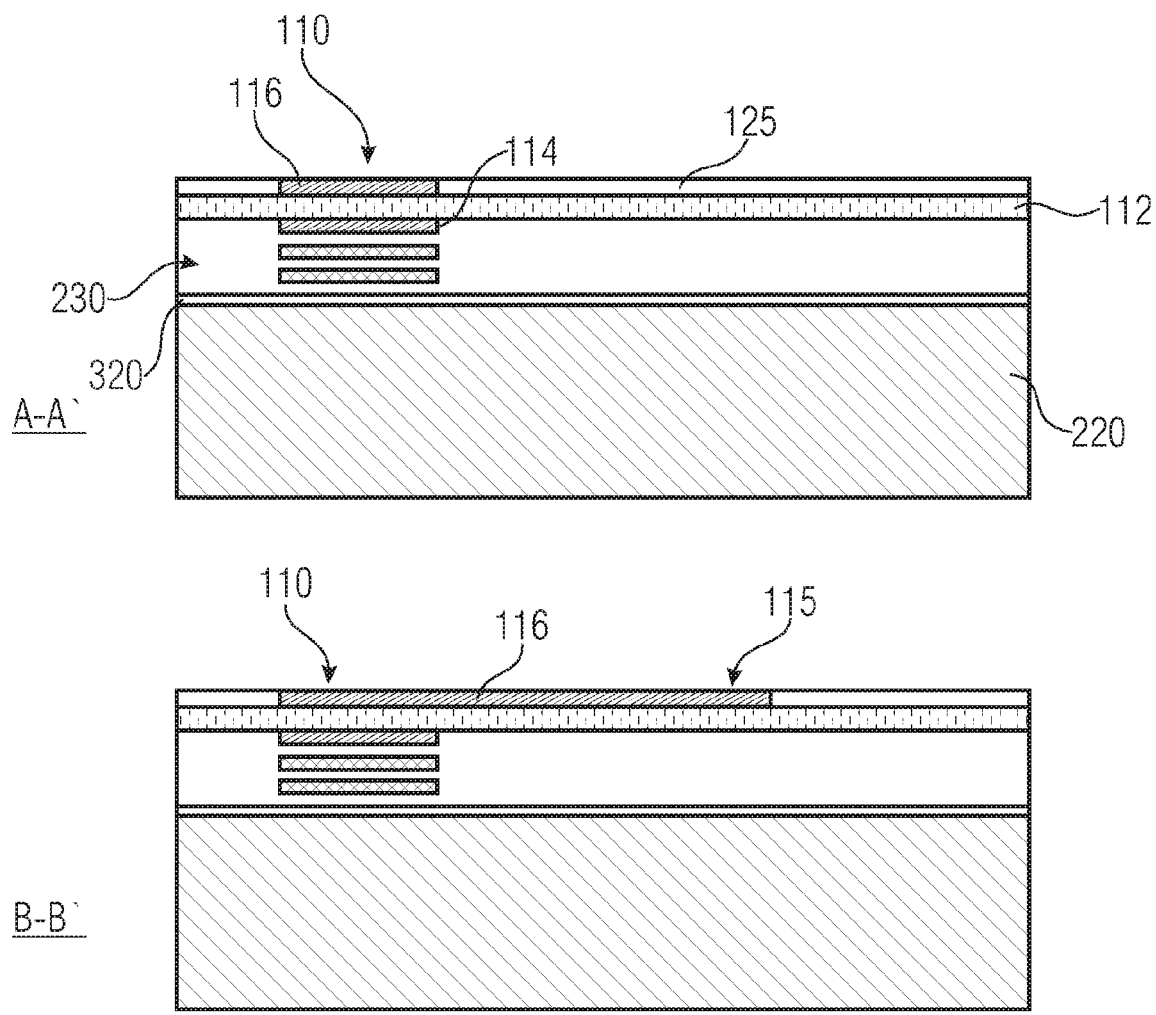

FIGS. 4a to 4c show processed BAW resonators used in a first process flow. The BAW resonators in the following figures can also comprise or be part of general BAW devices.

FIG. 4a shows a top view of a BAW resonator 110, which is laterally bounded by a seal edge 211 (along the layer) and the seal edge 211 indicates outer edge of the acoustic mirror 230. The arrangement of the acoustic mirror 230 can be such that the acoustic mirror 230 laterally exceeds the resonator or resonator region, so that in the top view of FIG. 4a the acoustic mirror covers a larger area than the BAW resonator. The first terminal 113 is connected with the first electrode 114 of the BAW resonator 110 and shown on the left-hand side in the top view of FIG. 4a. The second terminal 115 is connected with the second electrode 116 of the BAW resonator 110 is disposed at the bottom side in the top view of FIG. 4a. Further, FIG. 4a shows four cross-sectional lines: a first cross-sectional line A-A', a second cross-sectional line B-B', a third cross-sectional line C-C', and a fourth cross-sectional line D-D' along which the following cross-sectional views are shown.

FIG. 4b shows two cross-sectional views, a first cross-sectional view along the cross-section A-A', and a second cross-sectional view along the cross-section B-B'. In the first cross-sectional view, a BAW resonator 110 with the piezoelectric layer 112 sandwiched by the first electrode 114 and the second electrode 116 is shown. The BAW resonator 110 is disposed on an acoustic mirror 230, and the acoustic mirror 230 is separated from an underlying substrate 220 by an intermediate layer 320. The BAW resonator 110 extends only along a portion of the lateral extension of the piezoelectric layer 112, or the substrate 220, as can be seen from the top view in FIG. 4a. The position of the BAW resonator 110 is given by the sandwich structure of the first and second electrode 114 and 116.

The first cross-sectional view along the cross-sectional line A-A' further comprises a bonding layer 126 which ends flush with the second electrode 116 and comprises an insulating material (e.g., an oxide). In further processing along this bonding layer 126 a bond connection is formed.

The cross-sectional view along the second cross-section B-B' differs from the first cross-sectional view A-A' only in that the second electrode 116 extends laterally to the second terminal 115 and contacts it electrically. Thus, the second electrode 116 also extends outside the location at which the BAW resonator 110 is formed. In the top view of FIG. 4a, this lateral extension of the second electrode 116 is given by the lower portion of the cross-sectional line B-B'. All further structural features in the second cross-sectional view along B-B' are equivalent to the structures shown in the first cross-sectional view A-A', and a renewed description is here omitted.

The position of the second terminal 115 in the second cross-sectional view along cross-sectional line B-B' can later serve as a basis for a via-contact and a contact pad for the middle electrode of the coupled resonator. The BAW resonator 110 may also comprise a resonator stack (e.g., comprising multiple piezoelectric layers), for example, and the intermediate layer 320 may comprise a nitride, for example, and can later act as an etch stop layer. A further purpose for the intermediate layer 320, for example, comprise the fact that it diminishes tensions between the substrate 220 and an acoustic mirror 230 formed on top.

FIG. 4c shows two further cross-sectional views: a third cross-sectional view along the third cross-section C-C' and a fourth cross-sectional view along the fourth cross-section D-D'. The third cross-sectional view along the cross-section C-C' structurally matches the structure described in the first cross-sectional view A-A' (see also top view in FIG. 4a). Thus, a renewed description may here be omitted.

The fourth cross-sectional view along section line D-D' in turn comprises a BAW resonator 110 (resonator stack) in which the first electrode 114 is extended to the first terminal 113, so that the first electrode 114 extends also outside the region of the BAW resonator 110. The first electrode 114 thus extends along a contact region between the piezoelectric layer 112 and the substrate 220 or the acoustic mirror, wherein, outside this contact region, the bonding layer 126 is arranged and can, for example, later serve again for bonding. The piezoelectric layer 112 comprises an opening with contacting material to provide a through-contact (via-contact) to form the first terminal 113.

The first terminal 113, for example, serves as a basis to form a via-contact and a contact pad for the lower (or upper—depending on the final position after bonding) electrode for the coupled resonator processed later.

Two thus processed BAW resonators (the first and second BAW resonators 110a,b) may now be arranged on top of each other and bonded in a following step.

Prior to bonding the first BAW resonator 110a and the second BAW resonator 110b, in embodiments of the present invention, a measurement, for example, with respect to the resonance frequency of the first BAW resonator 110a and the resonance frequency of the second BAW resonator 110b is performed. This measurement can be done by contacting the first and second electrodes 114 and 116 and by applying a corresponding signal. As far as the characteristic of the individual resonators is known, the second electrode 116a of the first BAW resonator 110a and the second electrode 116b of the second BAW resonator 110b may be thinned correspondingly, to thereby change the resonance frequency of the respective BAW resonator. Alternatively, also additional material may be deposited on the electrodes 116a,b, so that the resonance frequency is adjustable in both directions. Here, it may be advantageous to design the second electrodes 116 to be slightly thicker with respect to the layer thickness, so that the resonance frequency can be adjusted correspondingly by thinning, for example, using an etching process. Adjusting the resonance frequency of one BAW resonator is done depending on the respective other resonance frequency of the other BAW resonator (bonding partner), so that a filter characteristic corresponding to default target values arises as a result of the acoustical coupling or also electrical coupling of the BAW resonators 110a and 110b. After such a trimming process has been executed, the two BAW resonators 110a, 110b may then be bonded on top of each other.

Figure 5A:
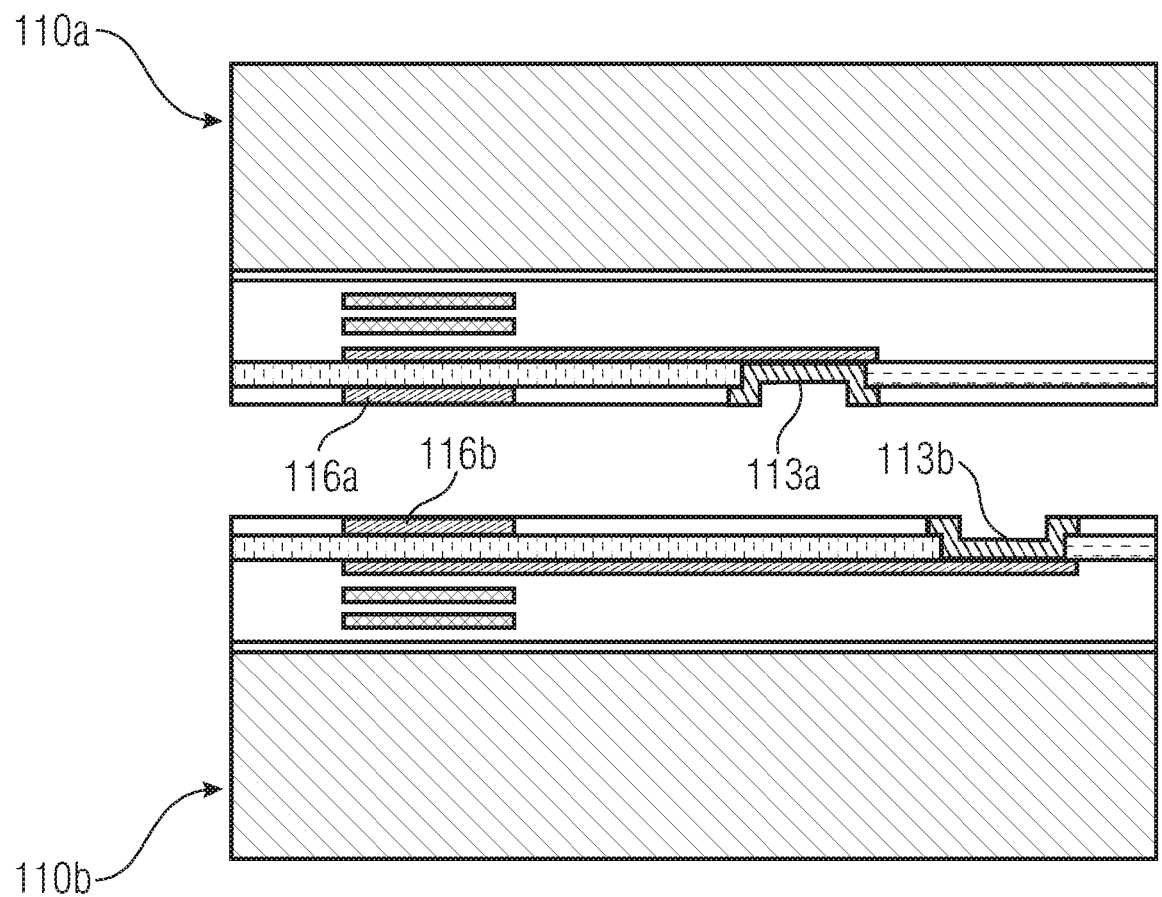

FIG. 5a shows a completely processed (and trimmed if needed) first and second BAW resonators 110a,b which are arranged on top of each other prior to bonding such that the second electrode 116a of the first BAW resonator 110a and the second electrode 116b of the second BAW resonator 110b are opposite to each other, so that they become electrically contactable upon bonding. The cross-sectional views for the first BAW resonator 110a in FIG. 5a, for example, correspond to the cross-sectional view of FIG. 4c along the sectional line D-D', wherein the first terminal 113a of the first BAW resonator 110a and the first terminal 113b of the second BAW resonator 110b correspondingly were processed in offset fashion, so that these two terminals are not electrically contacted to each other when bonding.

FIG. 5b shows the result of the bonding process, in which the second electrodes 116a and 116b of the first and second BAW resonators 110a and 110b are electrically contacted to each other, and the first terminal 113a of the first BAW resonator 110a is electrically insulated from the first terminal 113b of the second BAW resonator 110b, wherein the bonding layer 126 serve as insulating material. As a result of the bonding process, the layer stack of the first BAW resonator 110a and the second BAW resonator 110a is arranged between the first substrate 220a of the first BAW resonator 110a and the second substrate 220b of the second BAW resonator 110b. Furthermore, between the first substrate 220a and the first electrode 114a of the first BAW resonator 110a the first acoustic mirror 230a is arranged and, similarly, between the second substrate 220b and the first electrode 114b of the second BAW resonator 110b the second acoustic mirror 230b is formed.

FIG. 5c shows a top view onto the resulting layer structure, wherein the BAW resonator 110 extends across a resonator area bounded by a seal edge 211. The first terminal 113a of the first BAW resonator 110a here corresponds to the upper electrode in the cross-sectional view 5b, and the first terminal 113b of the second BAW resonator 110b here corresponds to the lower electrode in the cross-sectional view 5b. Furthermore, the two second terminals 115, which are not visible in the cross-sectional views 5a and 5b, are shown. The two second terminals 115, however, are electrically connected to each other by a contacting of the second electrodes 116a and 116b.

FIGS. 6a and 6b show a following step in a possible process flow. Here, in FIG. 6a, again a cross-sectional view corresponding to the cross-sectional view of FIG. 5b is shown. In the following step shown in FIG. 6a, for example, the first substrate 220a of the first BAW resonator 110a may, for example, be removed, wherein removing may, for example, comprise a milling process and/or an etching process, and the intermediate layer 320a may act as an etch stop layer.

In a following step, via-contacts may be performed to the first terminals 113a and 113b, so that a first via-contact 213a electrically connects to the first terminal 113a and a second via-contact 213b electrically connects to the first terminal 113b of the second BAW resonator 110b. The formation of the via-contacts 213a and 213b may, for example, comprise forming holes and filling with electrically conductive materials. Finally, contact pads may be formed on the surface 321 of the intermediate layer 320a, so that a first contact pad 313a serves for contacting the first electrode 114a of the first BAW resonator 110a and a second contact pad 313b can be used for electrical contacting of the first electrode 114b of the second BAW resonator 110b.

FIG. 6b again shows a top view on the resonator structure of which a cross-sectional view is to be seen in FIG. 6a. Only the first contact pad 313a and the second contact pad 313b can be contacted externally. The difference to the top view of FIG. 5c thus substantially includes forming the first and second contact pads 313a,b, wherein the second terminal 115 was illustrated as an electrode in FIG. 6b (since both are electrically contacted to each other).

In the same way a contact pad can be realized for the second terminal 115. As result, a SCF device (as the second SCF 210b shown in FIG. 2) is manufactured. By repeating the steps (supplemented by a removing of the first acoustic mirror 230a) also an SCF as the second SCF 210b in FIG. 2 can be manufactured.

Figure 7A:
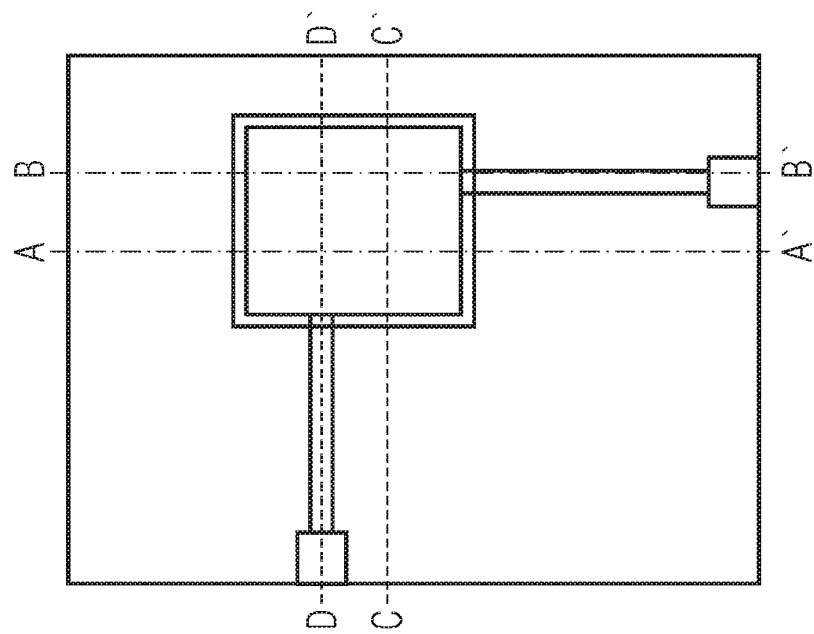
FIGS. 7a to 7c are a top view and cross-sectional views of a processed first BAW device.
Figure 7C:
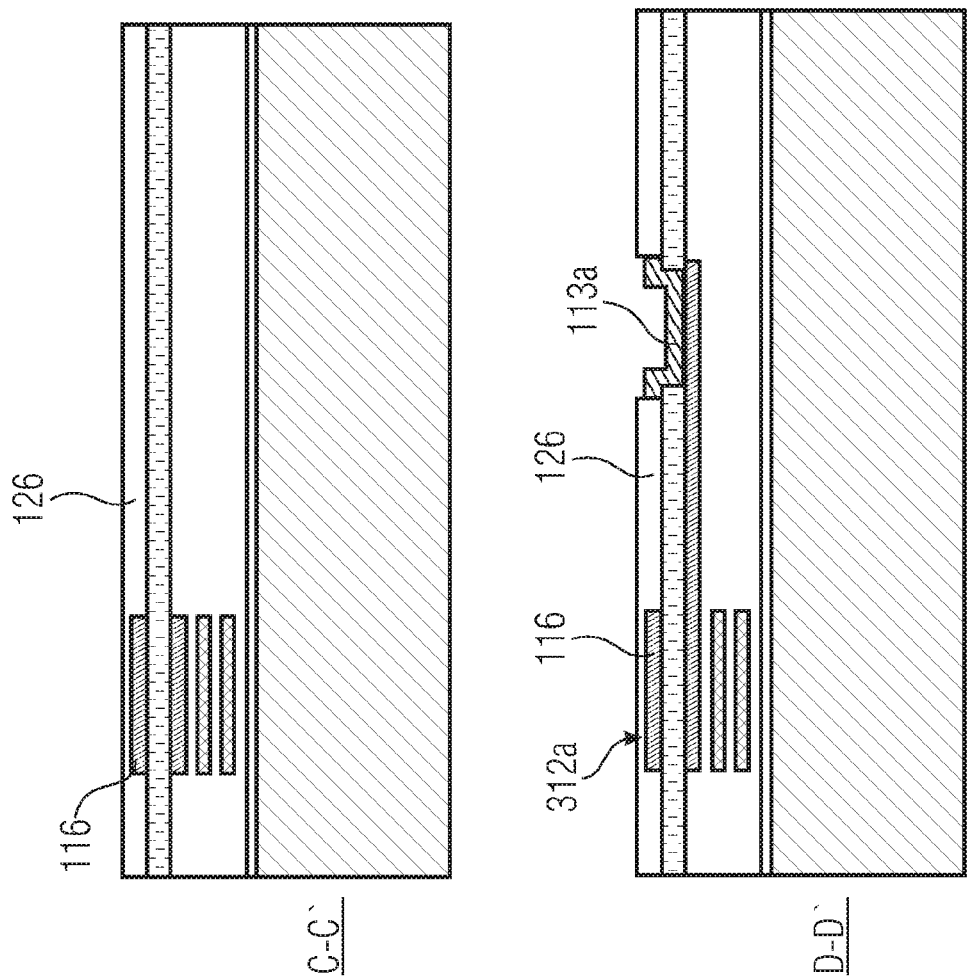
Figure 7B:
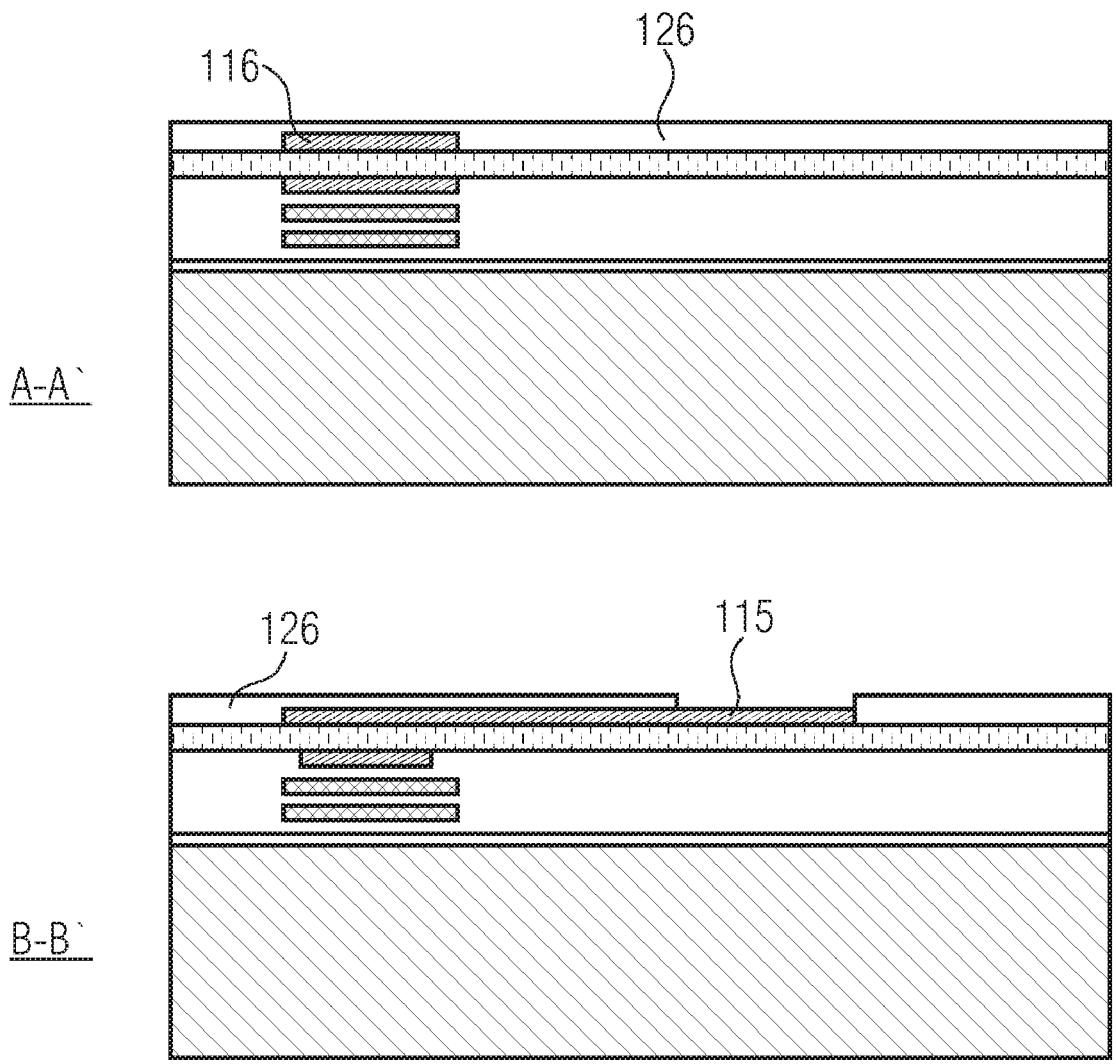

FIGS. 7a to 7c refer to a further process flow, wherein the starting point matches the process state shown in FIGS. 4a to 4c. The top view from FIG. 7a here corresponds to the top view from FIG. 4a, so that repeated description may be omitted.

FIG. 7b again shows two cross-sectional views, with one cross-sectional view showing along the sectional line A-A' and the second cross-sectional view along the sectional line B-B' (with respect to the top view in FIG. 7a). As compared with the cross-sectional views in FIG. 4b, in the process sequence as shown in FIG. 7b, the bonding layer 126 is formed on the second electrode 116 in the cross-sectional view A-A' so that it can serve later also as a first coupling layer 312 with low acoustic impedance (see FIG. 1). All further structural features correspond to the cross-sectional view along the sectional line A-A' in FIG. 4b. In the cross-sectional view along the sectional line B-B', the process sequence in FIG. 7b differs from the process sequence in FIG. 4b in that also the bonding layer 126 is formed on the second electrode 116 in the cross-sectional view along the sectional line B-B'. All further structural features in the cross-sectional view of FIG. 7b along the sectional line B-B' again correspond to the cross-sectional view from FIG. 4b, and a repeated description therefore is omitted here.

The cross-sectional views along the sectional lines C-C' and D-D' shown in FIG. 7c correspond to the cross-sectional views in FIG. 4c in analog manner, wherein the bonding layer 126, which comprises, for example, a material of low acoustic impedance, is again formed on the second electrode 116. The cross-sectional view along the sectional line D-D' shown in FIG. 7c differs from the corresponding cross-sectional view in FIG. 4c in that here the bonding layer 126 also formed on the second electrode 116 comprise an enlarged thickness and, hence, can serve as the acoustic coupling layer of low acoustic impedance. The cross-sectional views shown in FIGS. 7b and 7c here thus include a completely processed BAW resonator, for example the first BAW resonator 110a.

Figure 8B:
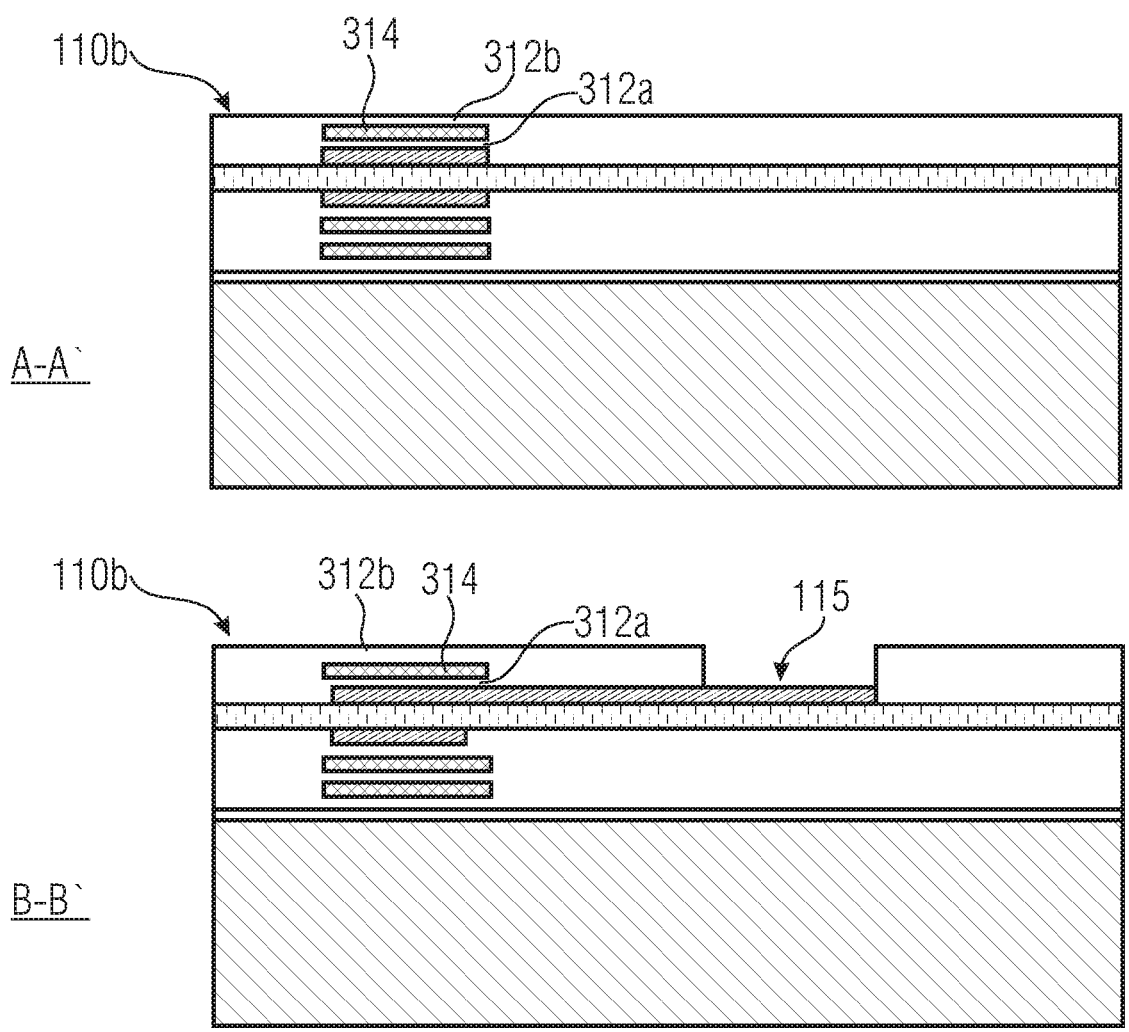

FIGS. 8a to 8b show analog processing of a further BAW resonator (for example, the second BAW resonator 110b). This further BAW resonator then is bonded onto the BAW resonator, as it is shown in FIGS. 7a to 7c, in a following process.

FIG. 8a here shows the top view corresponding to FIG. 7a, wherein again the sectional lines of the corresponding cross-sectional views are drawn in. In contrast to the top view from FIG. 7a, the sectional lines D-D' and C-C' are interchanged, so that the first terminal 113 now lies below the first terminal 113 in FIG. 7a. Furthermore, in the top view in FIG. 8a, the second terminal 115 is formed along the sectional line A-A', and the sectional line B-B' only passes through the BAW resonator 110.

FIG. 8b again shows the cross sections along the sectional line A-A' and the sectional line B-B', wherein a high acoustic impedance layer 314 and a further coupling layer with low acoustic impedance are formed on the coupling layer with low acoustic impedance as compared with the cross-sectional views from FIG. 7b. Both coupling layers can be formed by the bonding layer 126, i.e., can comprise the same material of low acoustic impedance (the same holds also for the following figures). Finally, there may only be one layer (the bonding layer 126), in which the high acoustic impedance layer 314 can optionally be embedded. All further structures in the cross-sectional views of FIG. 8b correspond to the structures from the cross-sectional views of FIG. 7b.

FIG. 8c shows the further processing of the further second BAW resonator 110b, which differs from the BAW resonator in FIG. 7c in that, in this further processing, again a high acoustic impedance layer 314 and a further layer of low acoustic impedance material are formed at the resonator region on the low acoustic impedance layer 312 with low acoustic impedance in FIG. 7c. These additional layers with low acoustic impedance 312b and with high acoustic impedance 314 here are to be seen both along the sectional line C-C' and along the sectional line D-D' in the cross-sectional views of FIG. 8c. All further structural features of the further BAW resonator, as it is shown in FIG. 8c, here correspond to the structural features of the BAW resonator, as it is shown in FIG. 7c, and renewed description is omitted here.

Before the first BAW resonator 110a, as it is described in FIG. 7, and the further second BAW resonator 110b, as it is described in FIG. 8, are bonded on top of each other in a following step, in embodiments, again measurements determining the respective resonance properties of the BAW resonator 110a and of the further second BAW resonator 110b in FIGS. 7 and 8 are performed. On the one hand, the measurement may here be done prior to depositing the layer with low acoustic impedance 312, in which the second electrode 116 lies open, so that the resonance frequency of the BAW resonator in FIG. 7 or the BAW resonator in FIG. 8 may be changed by a layer thickness variation of the second electrode 116.

A further measurement of the further second BAW resonator 110b, as it is shown in FIG. 8, may be done after depositing the layers with high and tow acoustic impedances. The contacting of the second electrode 116 may, for example, be done via the second terminal 115b, as it is shown in FIG. 8b along the cross section A-A' or in FIG. 7b along the sectional line B-B'. For example, the second trimming step may be performed, with respect to the high acoustic impedance layer 314, so that this trimming step preferably takes place prior to depositing the further layer with low acoustic impedance 312b. Depending on the resonance frequency the further second BAW resonator 110b exhibits here, the high acoustic impedance layer 314 may be changed with respect to its layer thickness (reduced by etching or also enlarged by additional layer material). After this second trimming step, the second layer with low acoustic impedance 312b can be deposited on the high acoustic impedance layer 314. A trim with respect to the high acoustic impedance layer 314 here is advantageous in comparison with a possible trim of a layer thickness with low acoustic impedance 312b. For these trimming steps with respect to the BAW resonator 110a in FIG. 7 as well as the second BAW resonator 110b in FIG. 8, it is again to be pointed out that the resulting resonance frequency is mutually interdependent (the difference of the two resonance frequencies plays an important role, for example).

After the BAW resonators have been trimmed, a bonding process may again arrange them on top of each other.

FIGS. 9a to 9d show this bonding process, with the process proceeding in a manner analog to the bonding process for the first process flow shown in FIGS. 5a to 5c.

In the cross-sectional view shown in FIG. 9a, the first BAW resonator 110a and the second BAW resonator 110b are again arranged on top of each other, and specifically such that the layers with low acoustic impedance 312 (or bonding layer 126 are arranged on top of each other and, in addition, that the resonator regions are laterally be aligned.

FIG. 9b shows a corresponding top view onto the coupled resonator device with the first and second BAW resonators 110a, b, the resonance area (resonator region) of which is bounded by the seal edge 211, wherein the first terminal 113a of the first BAW resonator 110a and the first terminal 113b of the second BAW resonator 110b are guided away laterally, and the second terminal 115a of the first BAW resonator 110a and the second terminal 115b of the second BAW resonator 110b are guided away downwardly. In the embodiment shown here, the second terminals 115 are not electrically connected to each other, since the BAW resonators 110a and 110b are coupled to each other only acoustically, but are not connected to each other electrically. The two second terminals 115a and b then become center electrodes each after the bonding, and the first terminal 113a of the first BAW resonator 110a is the upper electrode, and the first terminal 113b of the second BAW resonator 110b becomes the lower electrode (the notion of upper/lower refers only the specific cross-sectional views shown here and may be opposite in further embodiments).

Figure 9D:
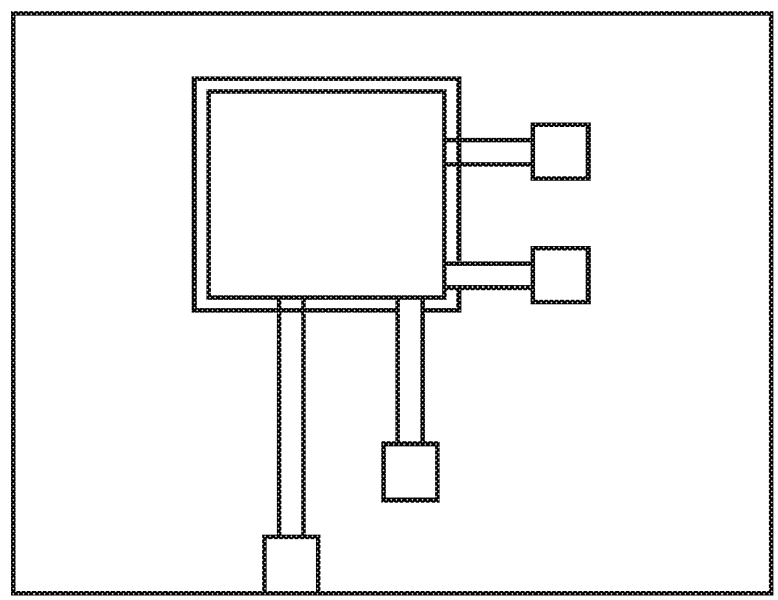
Figure 9C:
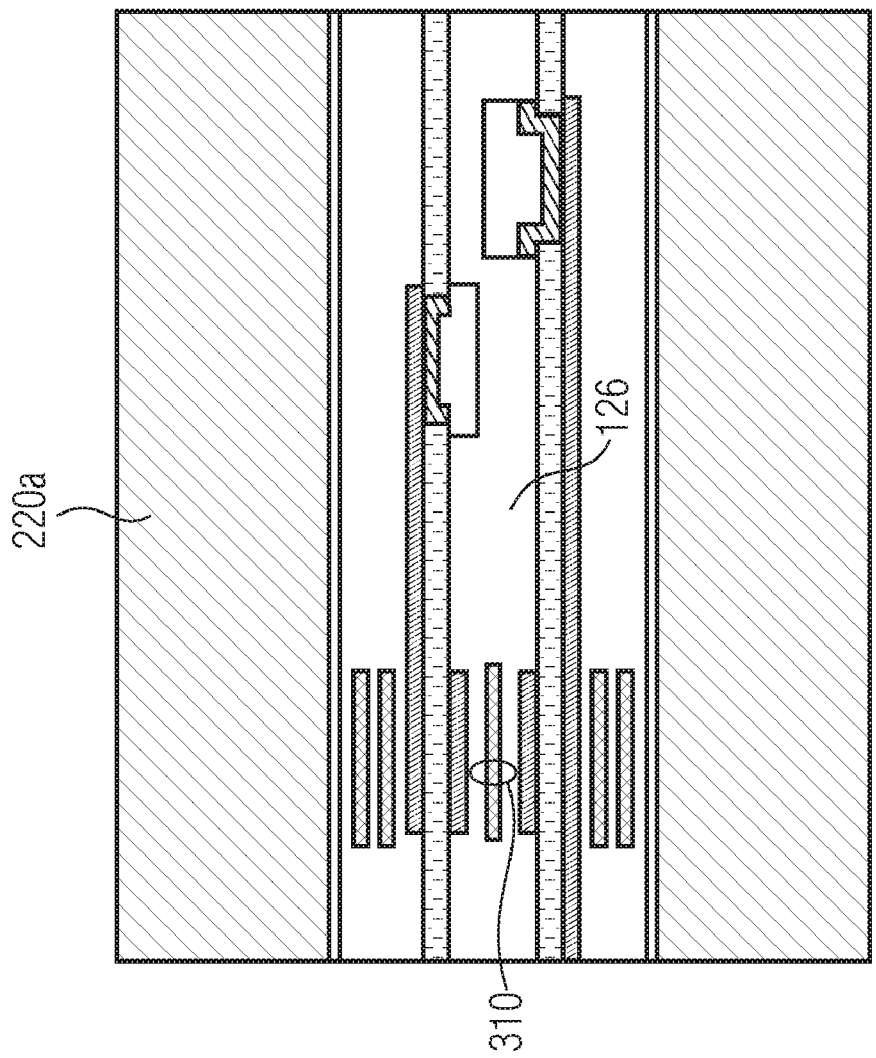

FIG. 9c shows the result of the first BAW resonator 110a bonded to the second BAW resonator 110b. The bond is formed so that the layer with low acoustic impedance 312 or the bonding layer 126 are connected to form a bond connection. The bonded resonator structure here differs from the resonator structure shown in FIG. 5b in that an acoustic coupling layer, which corresponds to the acoustic coupling layer 310 shown in FIG. 1, is formed between the first BAW resonator 110a and the second BAW resonator 110b. In the embodiment shown in FIG. 5, the two BAW resonators are coupled to each other in ideal (electrically conducting) manner, so that a stacked crystal filter develops, and a coupled resonator filter was created in the embodiment shown in FIG. 9. FIG. 9d finally shows a top view of the arrangement shown in FIG. 9c, wherein the top view of FIG. 9d corresponds to the top view of FIG. 9b, and repeated description may be omitted here.

In a further process shown in FIGS. 10a,b, again contact pads are formed, to which end at first one of the substrates, e.g., the first substrate 220a of the first BAW resonator 110a, is removed and a via-contact to the first terminal 113a of the first BAW resonator 110a and a further via-contact to the first terminal 113b of the second BAW resonator 110b are formed. The via-contacts again are filled with conductive material, and a first contact pad 313a for a via-contact to the first terminal 113a and a second contact pad 31b having an electrical connection to the first terminal 113b of the second BAW resonator 110b may finally be formed (the process steps are the same as shown in FIGS. 6a,b—only the bond layer comprise a different thickness and additional acoustic coupling layers 310 are present).

FIG. 10b shows a corresponding top view onto the resulting resonator structure, wherein the first contact pad 313a provides a connection to the first terminal 113a of the first BAW resonator 110a and the second contact pad 313b provides a connection to the first terminal 113b of the second BAW resonator 110b.

In the remaining figures, yet a further process flow slightly deviating from the second process flow is described, wherein the bonded resonator structure shown in FIG. 9c serves as starting point.

The cross-sectional view shown in FIG. 11a corresponds to the cross-sectional view shown in FIG. 9c, and the top views of FIGS. 11b and 9d also correspond to each other, so that repeated description may be omitted here.

Figure 12A:
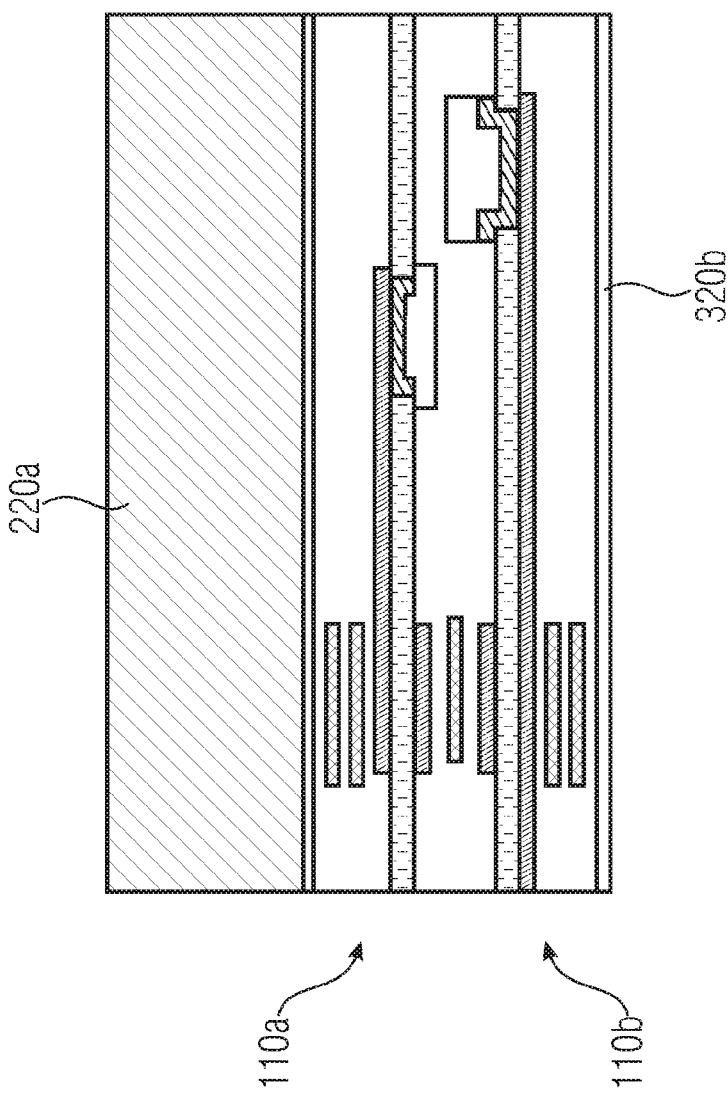
FIGS. 12a and 12b are a top view and a cross-sectional view through the acoustic resonator in FIG. 11 after substrate removal.
Figure 12B:
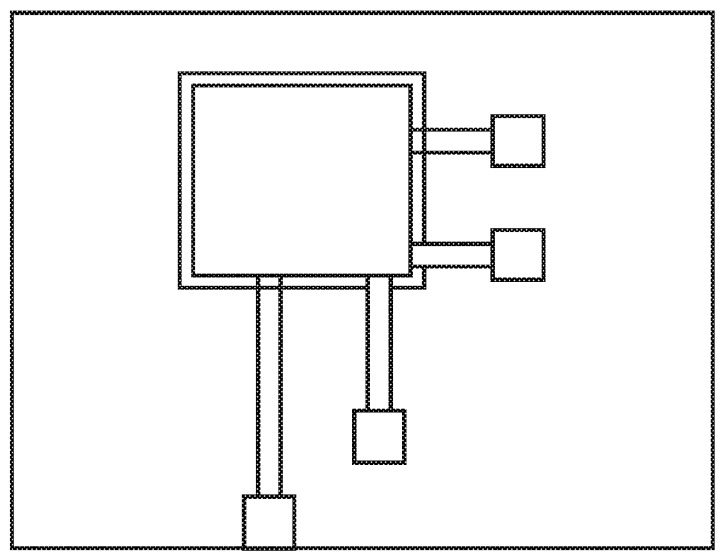

In this modified process, instead of the first substrate 220a of the first BAW resonator 110a, the second substrate 220b of the second BAW resonator 110b is removed so that the device shown in FIG. 12a develops (the top view in FIG. 12b is identical with the top view in FIG. 11b). Removing the second substrate 220b of the second BAW resonator 110b may here again comprise milling and/or etching, wherein the intermediate layer 320b may serve as etch stop layer.

Figure 13B:
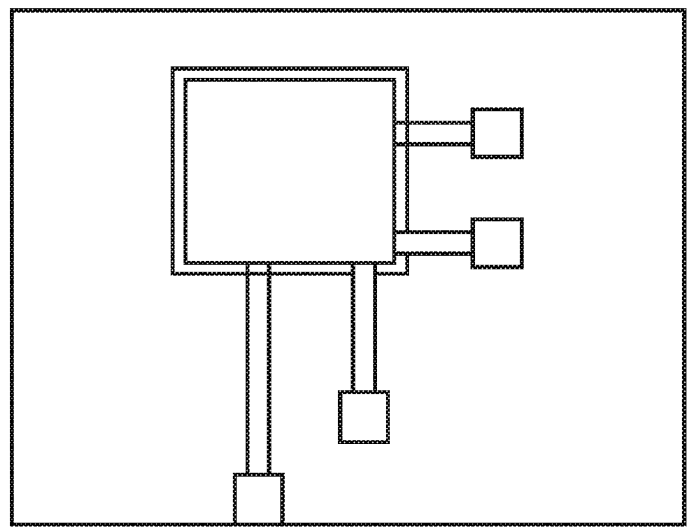
FIGS. 13a and 13b are a top view and a cross-sectional view through the coupled resonator of FIG. 11 after depositing a thermal release film and a supporting substrate.
Figure 13A:
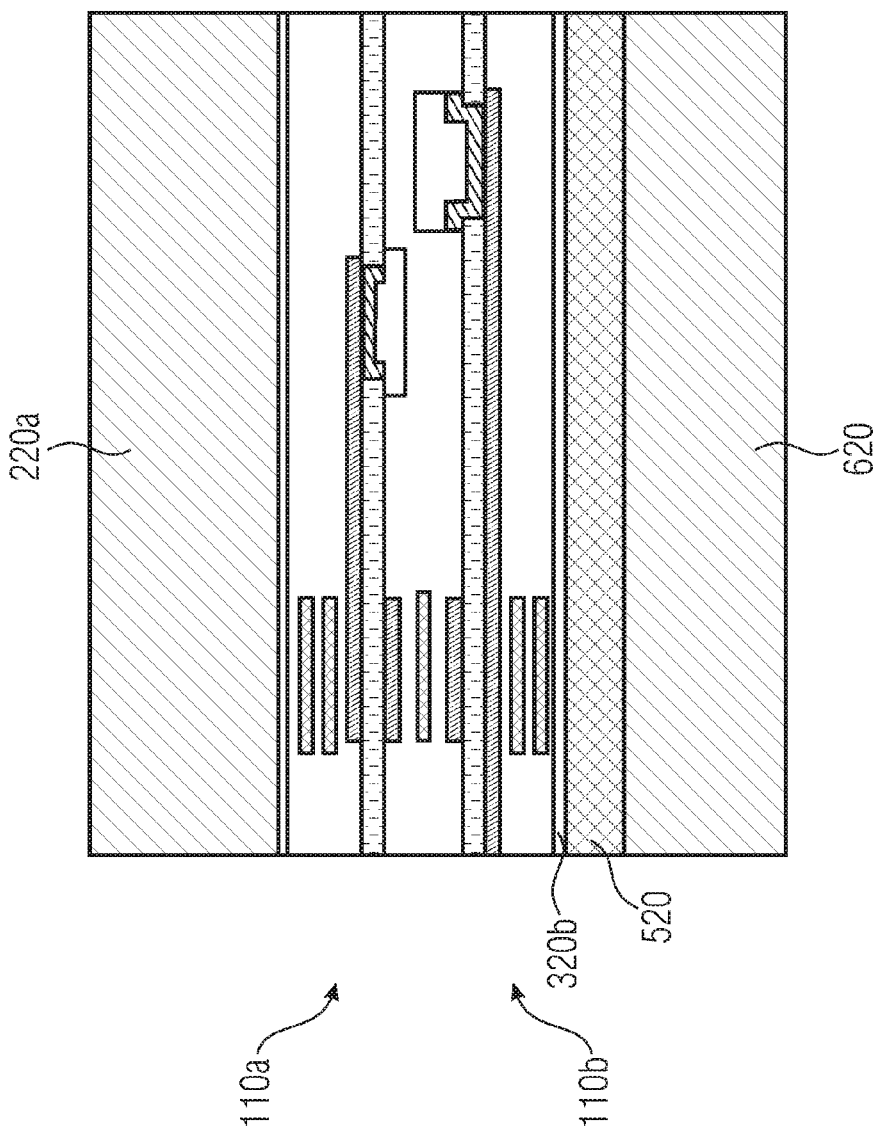

FIG. 13a shows a further process step, in which at first a release layer 520 is formed on the intermediate layer 320b, and then a supporting substrate 620 is disposed on the release layer 520. The supporting substrate 620 here, for example, serves for mechanical fixing of the device, and the release layer 520 is formed so as to be easily detached, for example, by a thermal or UV radiation treatment. The top view of FIG. 13b again is identical with the top view from FIG. 12b.

Figure 14B:
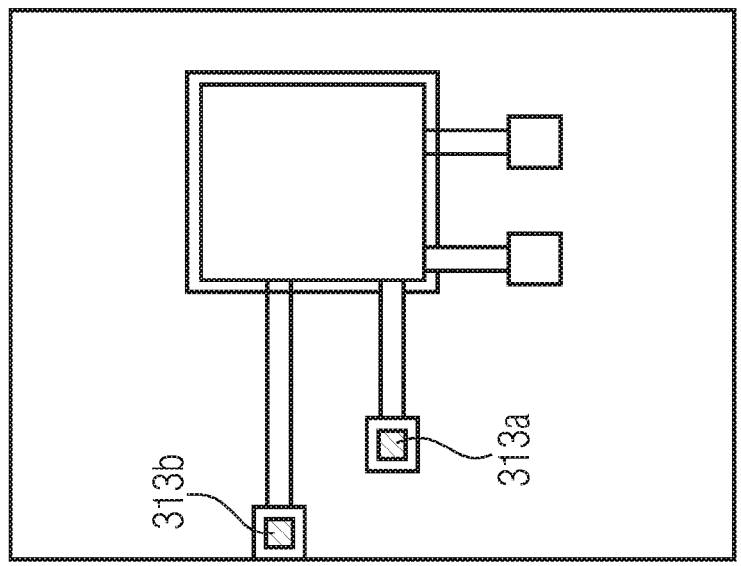
FIGS. 14a and 14b are a top view and a cross-sectional view through the coupled resonator of FIG. 11 after removing a substrate removal and generating via contacts.
Figure 14A:
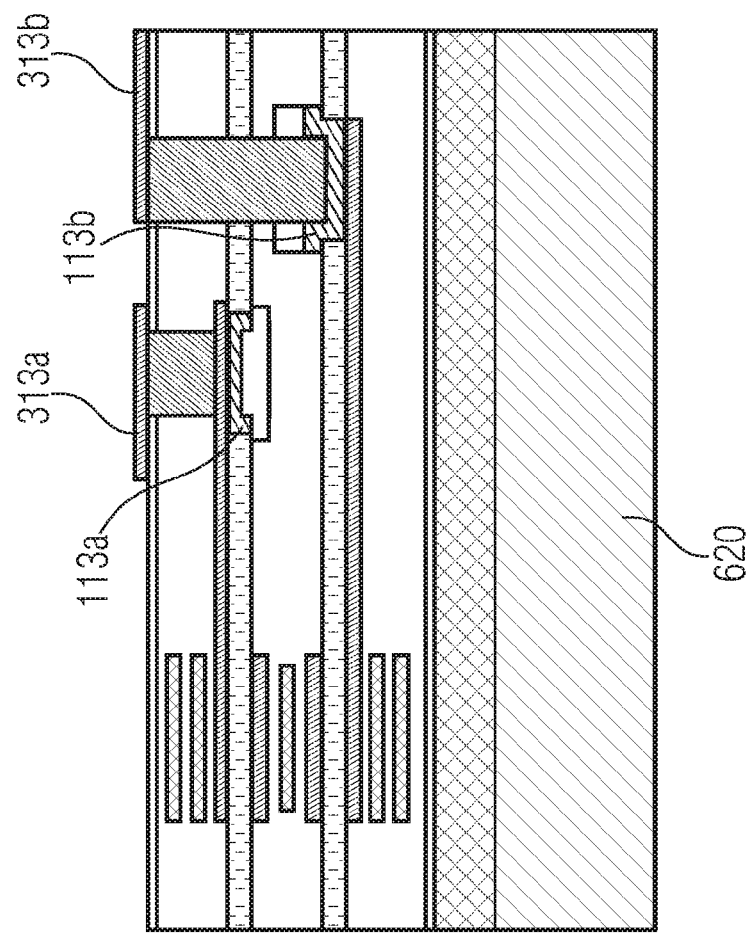

As a further process step, FIG. 14a shows that the first substrate 220a of the first BAW resonator 110a is as next step removed, and via-contacts to the first terminal 113a of the first BAW resonator 110a and to the first terminal 113b of the second BAW resonator 110b are formed thereafter. As a following step, again contact pads may be formed, i.e., a first contact pad 313a is connected to the first terminal 113a of the first BAW resonator 110a, and a second contact pad 313b is connected to the first terminal 113b of the second BAW resonator 110b. These process steps are equivalent to the process steps of the formation of the contact pads shown in FIG. 10a or FIG. 6a (the top view in FIG. 14b also is equal to the top view in FIG. 10b).

FIG. 15a shows how first and second solder balls 413a,b are formed on the contact pads in a next step. Here, a first solder ball 413a is formed on the first contact pad 313a, and a second solder ball 413b is formed on the second contact pad 313b (FIG. 15b again is identical with FIG. 14b).

In a last step of the processing, as it is shown in FIG. 16a, at first a saw film 500 is laminated on, and then the supporting substrate 620 and the corresponding release layer 520 may be removed. The removing may here, for example, be performed under the influence of temperature or under the influence of UV radiation. The saw film 500 then ensures the mechanical hold further. FIG. 16b again is identical with FIG. 15b, and repeated description therefore may be omitted here.

In further embodiment the process flow can be repeated/continued to obtain BAW devices with more piezoelectric layers (for which at least one of the acoustic mirrors may be redundant). Also here, along the process flow multiple trimming steps can be performed (e.g., whenever an upper electrode of the BAW device is accessible).

In yet a further embodiment the process steps are applied not only to single resonators formed on substrates, but on whole BAW-wafers, each BAW-wafer comprising a plurality of BAW-resonators. This means, before bonding the respective BAW-wafers the trimming is done for the plurality of BAW resonators on each BAW-wafer. In this trimming the BAW resonators that are going to be bonded with each other are trimmed with respect to each other. Hence, the target frequency of the trimmed BAW resonators on one BAW-wafer may be equal, but can also be different, as long as they are trimmed with respect to their (perspective) bonding partner on the other BAW-wafer.

The trimming can again comprise adjusting a thickness of an electrode layer of a BAW-device such that its resonance frequency changes. This trimming can be done for at least one BAW-device or BAW-resonator of the plurality of BAW-resonators, wherein the plurality of BAW-resonators can comprise a first plurality of BAW-resonators of a first BAW-wafer and a second plurality of BAW-resonators of a second BAW-wafer. In further embodiments all BAW-resonators of the first plurality or all BAW-resonators of the second plurality are trimmed by adjusting the layer thickness of the respective electrode layers.

Possible materials for layers with high acoustic impedance comprise, for example: W, Mo, Pt, Ta, TiW, TiN, Ir, WSi, Au, $Al_2O_3$, SiN, $Ta_2O_5$ and zirconium-oxide, wherein the last four are dielectrical materials. Possible materials for the piezoelectric layers are, for example, AlN, ZnO, PZT and $LiNbO_3$. Materials for lower acoustic impedance are, for example, aluminum and silicon dioxide.

In further embodiments, other materials or metals for the electrodes, types of the semiconductor, piezoelectric materials, and acoustic mirror materials are possible. Moreover, the electrodes of the BAW resonators may comprise a layer stack of different materials and the trimming can, for example, be performed with respect to a layer of this layer stack.

What is claimed is:

1. A method for manufacturing a coupled resonator device, the method comprising:
   forming a first BAW-device on a first substrate;
   forming a second BAW-device on a second substrate;
   bonding the first and the second BAW-device such that the bonded first and second BAW-device are sandwiched between the first and second substrate;
   trimming the first BAW-device; and
   trimming the second BAW-device depending on the trimmed first BAW-device.

2. The method of claim 1, wherein the first BAW-device exhibits a first resonance frequency and wherein the second BAW-device exhibits a second resonance frequency, and wherein trimming of the first BAW-device comprises adjusting the first resonance frequency depending on the second resonance frequency.

3. The method of claim 2, wherein the trimming is performed such that a difference between the first and the second resonance frequencies comprises a target value.

4. The method of claim 1, wherein forming the first and second BAW-devices comprises forming a piezoelectric layer sandwiched by a first and second electrode layer.

5. The method of claim 4, further comprising trimming the first BAW-device wherein the trimming comprises etching the first or second electrode layer.

6. The method of claim 4, further comprising trimming the first BAW-device, wherein the trimming comprises adding further layer material to one of the first or second electrode layer.

7. The method of claim 1, further comprising forming a coupling layer, wherein the coupling layer is arranged between the first BAW-device and the second BAW-device, such that the first and second BAW-devices are electrically isolated and acoustically coupled.

8. The method of claim 7, wherein the first BAW-device exhibits a first resonance frequency and wherein the second BAW-device exhibits a second resonance frequency and wherein the coupling layer comprises a coupling layer thickness, the method further comprising adjusting the coupling layer thickness depending on the first or second resonance frequency.

9. The method of claim 7, wherein the coupled resonator device shows a filter characteristic with a bandwidth and an attenuation within a certain frequency range, the method further comprising trimming an electrode layer or trimming the coupling layer, such that the filter characteristic is within target values.

* * * * *